(12) United States Patent
Tsukao

(10) Patent No.: US 10,957,462 B2
(45) Date of Patent: Mar. 23, 2021

(54) ANISOTROPIC CONDUCTIVE FILM

(71) Applicant: DEXERIALS CORPORATION, Tokyo (JP)

(72) Inventor: Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/463,422

(22) PCT Filed: Nov. 20, 2017

(86) PCT No.: PCT/JP2017/041701
§ 371 (c)(1),
(2) Date: May 23, 2019

(87) PCT Pub. No.: WO2018/101108
PCT Pub. Date: Jun. 7, 2018

(65) Prior Publication Data
US 2020/0152351 A1    May 14, 2020

(30) Foreign Application Priority Data

Dec. 1, 2016   (JP) .............................. JP2016-233712
Aug. 23, 2017  (JP) .............................. JP2017-160674

(51) Int. Cl.
*H05K 3/32*       (2006.01)
*H05K 1/11*       (2006.01)
(Continued)

(52) U.S. Cl.
CPC ............... *H01B 5/16* (2013.01); *H01R 11/01* (2013.01); *H01R 43/007* (2013.01); *H05K 1/11* (2013.01);
(Continued)

(58) Field of Classification Search
CPC ........ H05K 3/305; H05K 3/321; H05K 3/323; H05K 1/11; H05K 1/14; H05K 3/32
See application file for complete search history.

(56) References Cited

U.S. PATENT DOCUMENTS

2010/0018755 A1   1/2010  Tatsuzawa et al.
2015/0214176 A1   7/2015  Shinohara
(Continued)

FOREIGN PATENT DOCUMENTS

CN    101512840 A    8/2009
JP    2886503 B2     4/1999
(Continued)

OTHER PUBLICATIONS

Jan. 30, 2018 International Search Report issued in International Patent Application No. PCT/JP2017/041701.
(Continued)

*Primary Examiner* — Jeremy C Norris
(74) *Attorney, Agent, or Firm* — Oliff PLC

(57) ABSTRACT

In a connection structure, a first electronic component having a first terminal pattern and a second electronic component having a second terminal pattern different in size and pitch from the first terminal pattern are anisotropically conductively connected by an anisotropic conductive film to a third electronic component having a terminal pattern corresponding to each of the first terminal pattern and the second terminal pattern. The anisotropic conductive film has at least one of a region in which conductive particles are regularly arranged, and a plurality of regions in which at least one of a number density, a particle diameter, and a hardness of the conductive particles in one region is different from that in the other region.

23 Claims, 11 Drawing Sheets (C-C Cross-Sectional View)

(51) Int. Cl.
   *H01B 5/16* (2006.01)
   *H01R 11/01* (2006.01)
   *H01R 43/00* (2006.01)
(52) U.S. Cl.
   CPC ....... *H05K 3/32* (2013.01); *H05K 2203/0278* (2013.01)

(56) References Cited

U.S. PATENT DOCUMENTS

| | | | |
|---|---|---|---|
| 2016/0155717 | A1 | 6/2016 | Saruyama et al. |
| 2017/0103959 | A1 | 4/2017 | Akutsu et al. |
| 2017/0323701 | A1 | 11/2017 | Ishimatsu et al. |
| 2017/0352967 | A1* | 12/2017 | Hayashi ................ H01B 5/14 |

FOREIGN PATENT DOCUMENTS

| | | |
|---|---|---|
| JP | 2010-171023 A | 8/2010 |
| JP | 4650050 B2 | 3/2011 |
| JP | 2015-201435 A | 11/2015 |
| JP | 2016-085984 A | 5/2016 |
| JP | 2016-119306 A | 6/2016 |
| KR | 10-2009-0052373 A | 5/2009 |
| KR | 10-2015-0048670 A | 5/2015 |
| WO | 2008/029580 A1 | 3/2008 |
| WO | 2008/143358 A1 | 11/2008 |
| WO | 2014/030744 A1 | 2/2014 |
| WO | 2015/016207 A1 | 2/2015 |
| WO | 2015/151874 A1 | 10/2015 |
| WO | 2016/104463 A1 | 6/2016 |

OTHER PUBLICATIONS

Jan. 30, 2018 Written Opinion of the International Searching Authority issued in International Patent Application No. PCT/JP2017/041701.

Nov. 6, 2018 Written Opinion of the International Preliminary Examining Authority issued in International Patent Application No. PCT/JP2017/041701.

Mar. 1, 2019 International Preliminary Report on Patentability issued in International Patent Application No. PCT/JP2017/041701.

May 19, 2020 Office Action issued in Korean Patent Application No. 10-2019-7014001.

Mar. 31, 2020 Office Action issued in Chinese Patent Application No. 201780071463.9.

* cited by examiner (A-A Cross-Sectional View)

(A-A Cross-Sectional View)

(A-A Cross-Sectional View)

(B-B Cross-Sectional View)

(B-B Cross-Sectional View)

(C-C Cross-Sectional View)

(X-X Cross-Sectional View)

ANISOTROPIC CONDUCTIVE FILM

TECHNICAL FIELD

The present invention relates to an anisotropic conductive film.

BACKGROUND ART

For example, in a liquid crystal display device, a plurality of types of electronic components are each connected to a single substrate by using respective anisotropic conductive films, such as by connecting both an IC chip and a flexible printed circuit (FPC) to the end portion of a glass substrate. In this case, an anisotropic conductive film adapted to each of a plurality of types of electronic components is used.

On the other hand, it has been proposed to connect two types of electronic components to a single substrate by using one sheet of an anisotropic conductive film (Patent Literature 1).

CITATION LIST

Patent Literature

Patent Literature 1: Japanese Patent No. 4650050

SUMMARY OF INVENTION

Technical Problem

When two types of electronic components are connected to a single substrate using one sheet of an anisotropic conductive film, the number of steps and space required for connection can be reduced.

However, since the conventional anisotropic conductive film used for connecting two types of electronic components to a single substrate is obtained by randomly dispersing the conductive particles in an insulating resin layer, the dispersion state of the conductive particles in the anisotropic conductive film cannot be precisely controlled. Therefore, the number density of the conductive particles in the anisotropic conductive film needs to be adapted to the smaller one of the two types of electronic components in terms of the size and pitch of the terminals thereof, and therefore, there are many useless conductive particles that do not participate in the connection.

An object of the present invention in response to the conventional technical problem is to further adapt an anisotropic conductive film to each electronic component to reduce useless conductive particles not involved in connection when a plurality of types of electronic components such as an IC chip and an FPC are connected to an electronic component such as a single substrate using one sheet of an anisotropic conductive film.

Solution to Problem

The present inventor has found that, when a first electronic component and a second electronic component having different terminal patterns are connected to a third electronic component by using one sheet of an anisotropic conductive film, the pitch and arrangement direction of the conductive particles can be controlled by regularly arranging the conductive particles in the anisotropic conductive film, so that the number density of the conductive particles necessary for appropriately connecting both of the first electronic component and the second electronic component to the third electronic component can be reduced compared with the case where the conductive particles are randomly disposed. The present inventor has also found that the yield of the connection structure in which the anisotropic conductive connection is achieved can be easily improved, and further that, when a plurality of regions having different number densities, particle diameters, hardnesses, and the like of the conductive particles are provided in one sheet of an anisotropic conductive film, it becomes possible to perform more suitable connection with each of the first electronic component and the second electronic component, so that the useless conductive particles can be further reduced.

That is, a first aspect of the present invention is a connection structure in which a first electronic component having a first terminal pattern and a second electronic component having a second terminal pattern different in size and pitch from the first terminal pattern are anisotropically conductively connected by an anisotropic conductive film to a third electronic component having a terminal pattern corresponding to each of the first terminal pattern and the second terminal pattern, wherein the anisotropic conductive film has at least one of a region in which conductive particles are regularly arranged, and a plurality of regions in which at least one of a number density, a particle diameter, and a hardness of the conductive particles in one region is different from that in the other region.

A second aspect of the present invention is an anisotropic conductive film having an insulating resin layer and conductive particles disposed in the insulating resin layer, wherein the anisotropic conductive film has a plurality of regions in which at least one of a number density, a particle diameter, and a hardness of the conductive particles in one region is different from that in the other region.

A third aspect of the present invention is a method for producing an anisotropic conductive film, including:

a first pushing step of attaching conductive particles to one surface of an insulating resin layer and pushing the conductive particles into the insulating resin layer; and a second pushing step of attaching conductive particles to a region that is a part of a region where the conductive particles have been pushed in in the first pushing step, or to a region that includes the entire region where the conductive particles have been pushed in in the first pushing step, or to a region that partially overlaps with the region where the conductive particles have been pushed in in the first pushing step, and pushing the conductive particles into the insulating resin layer, wherein a plurality of regions having at least one of a number density, a particle diameter, and a hardness of conductive particles in one region is different from that in the other region are formed.

A fourth aspect of the present invention is a method for producing a connection structure including anisotropically conductively connecting a first electronic component having a first terminal pattern and a second electronic component having a second terminal pattern different in size and pitch from the first terminal pattern to a third electronic component having a terminal pattern corresponding to each of the first terminal pattern and the second terminal pattern by an anisotropic conductive film, wherein an anisotropic conductive film having at least one of a region in which conductive particles are regularly arranged and a plurality of regions in which at least one of a number density, a particle diameter, and a hardness of the conductive particles in one region is different from that in the other region is used as the anisotropic conductive film.

Advantageous Effects of Invention

Since the first electronic component and the second electronic component are anisotropically conductively connected to the third electronic component by one sheet of an anisotropic conductive film, the production process can be simplified as compared with the case where the anisotropic conductive film is changed for each electronic component to be connected to the third electronic component, and the connection structure of the present invention can be produced at low cost. Moreover, the connection structure is produced by using an anisotropic conductive film having a region in which the conductive particles are regularly arranged or a plurality of regions in which at least one of the number density, the particle diameter, and the hardness of the conductive particles in one region is different from that in the other region as the anisotropic conductive film. Therefore, the anisotropic conductive film is compatible with each of the first electronic component and the second electronic component, and useless conductive particles are reduced, even though the connection structure is produced by using one sheet of the anisotropic conductive film.

Since the anisotropic conductive film of the present invention has a region in which conductive particles are regularly arranged or a plurality of regions in which at least one of the number density, the particle diameter, and the hardness of the conductive particles in one region is different from that in the other region, these regions can be made to correspond to the respective terminal patterns of the first electronic component and the second electronic component. Therefore, as described above, waste of the conductive particles in the anisotropic conductive film is reduced.

DESCRIPTION OF EMBODIMENTS

Figure 1:
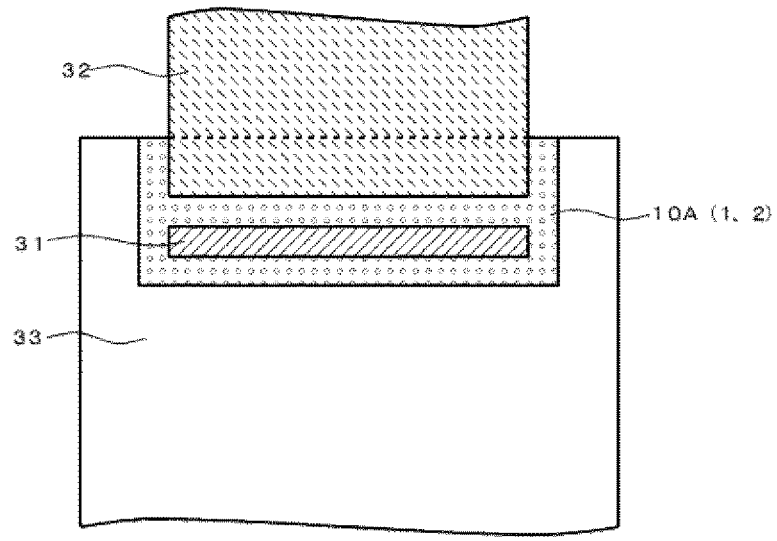
FIG. 1 is a schematic plan view of a first connection structure 40A of the present invention.

The present invention will be described below in detail with reference to the drawings. Note that the same reference numerals in the drawings denote the same or equivalent components.

[First Connection Structure]

(Overall Configuration)

FIG. 1 is a schematic plan view of a first connection structure 40A among aspects of the connection structure of the present invention. In the connection structure 40A, a first electronic component 31 having a first terminal pattern and a second electronic component 32 having a second terminal pattern different in size and pitch from the first terminal pattern are anisotropically conductively connected to a third electronic component 33 having a terminal pattern corresponding to each of the first terminal pattern and second terminal pattern by an anisotropic conductive film 10A. In the present embodiment, for example, an electronic component such as an IC chip or an IC module is connected as the first electronic component 31, and an electronic component such as an FPC is connected as the second electronic component 32. As the third electronic component 33 to which these components are connected, a glass substrate, a plastic substrate, a rigid substrate, a ceramic substrate, or the like is used. In the present invention, the types of the first electronic component, the second electronic component, and the third electronic component are not particularly limited.

A plurality of IC chips, IC modules, and the like may be connected as the first electronic component and the second electronic component.

Figure 2:
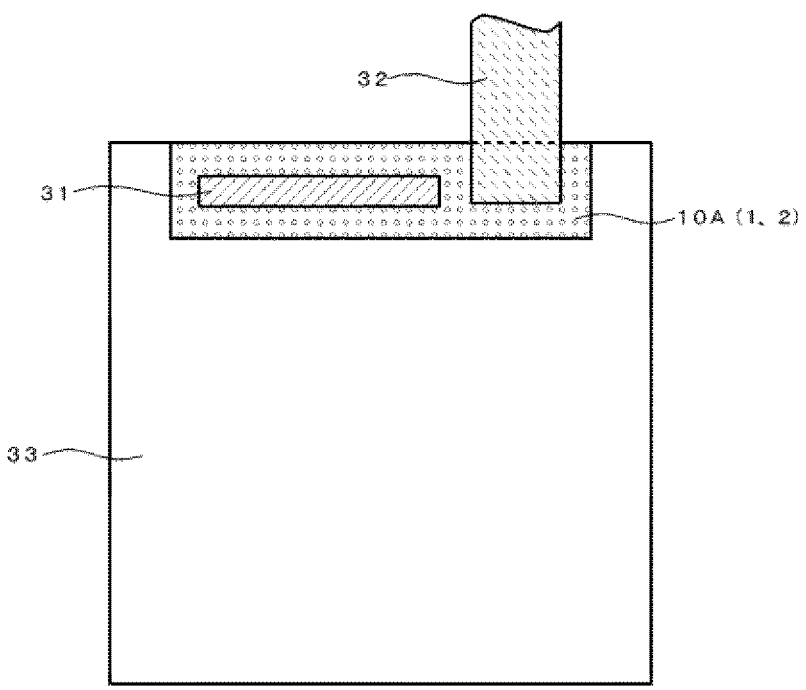
FIG. 2 is a schematic plan view of the first connection structure 40A of the present invention.
Figure 3:
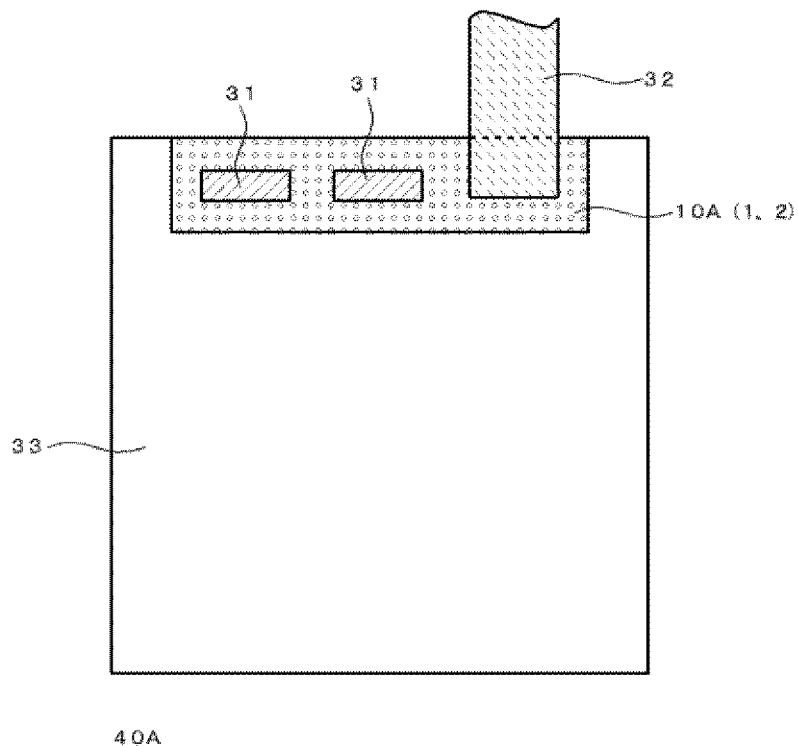
FIG. 3 is a schematic plan view of the first connection structure 40A of the present invention.

In FIG. 1, the first electronic component 31 is connected to the third electronic component 33 on one end side in the short-side direction of the anisotropic conductive film 10A, and the second electronic component 32 is connected to the third electronic component 33 on the other end side. However, these dispositions are not particularly limited when the first electronic component 31 and the second electronic component 32 are connected to the third electronic component 33 with one sheet of the anisotropic conductive film 10A. For example, as shown in FIG. 2, the first electronic component 31 and the second electronic component 32 may be arranged in the long-side direction of the anisotropic conductive film 10A side by side. As shown in FIG. 3, a plurality of first electronic components 31 may be connected to the third electronic component 33, and a plurality of second electronic components 32 may be connected to the third electronic component 33.

(Anisotropic Conductive Film in the First Connection Structure)

In the anisotropic conductive film 10A used for producing the first connection structure 40A of the present invention, conductive particles 1 are regularly arranged in an insulating resin layer 2. Therefore, the first connection structure 40A after the first electronic component 31 and the second electronic component 32 have been anisotropically conductively connected using the anisotropic conductive film 10A also has at least a region in which the conductive particles are regularly arranged in a portion to which neither the first electronic component 31 nor the second electronic component 32 is connected.

Regular Arrangement and Number Density of Conductive Particles

Regarding the anisotropic conductive film 10A used for producing the first connection structure 40A, examples of the regular arrangement of the conductive particles may include a square lattice, a hexagonal lattice, a rhombic lattice, and a rectangular lattice. The lattice arrangement also includes a lattice arrangement from which some conductive particles forming such a lattice arrangement are intentionally removed. The method of removing the conductive particles is not particularly limited as long as the conductive particles are still regularity arranged in the long-side direction of the film. In addition, as the particle disposition of the entire conductive particles, particle rows in which the conductive particles 1 are linearly arranged at predetermined intervals may be arranged in parallel at predetermined intervals. Regularly arranging the conductive particles and controlling the pitch and the arrangement direction of the conductive particles can facilitate the optimization of the number density of the conductive particles required for connecting both the first electronic component and the second electronic component to the third electronic component. In the conventional anisotropic conductive film with which both the first electronic component and the second electronic component are connected to the third electronic component, since the conductive particles are randomly disposed, the number density of the conductive particles in the anisotropic conductive film is adjusted to the higher one of the number density suitable for connection of the first electronic component and the number density suitable for connection of the second electronic component, and therefore, many conductive particles are wastefully used. On the contrary, in the first connection structure 40A of the present invention, since the conductive particles in the anisotropic conductive film is regularly arranged as described above, the number density of the conductive particles can be easily optimized, and thus wastefulness of the conductive particles can be reduced.

For example, when the first electronic component and the third electronic component are COG-connected and the second electronic component and the third electronic component are FOG-connected, the number density of the conductive particles in the anisotropic conductive film 10A may be less than 35,000 particles/mm$^2$.

Area Occupancy Rate

At the time of determining the number density of the conductive particles in the anisotropic conductive film 10A, the area occupancy rate calculated by the following equation from the number density of the conductive particles and the average area of one conductive particle in a plan view become an index of the thrust required by the pressing jig for thermocompression bonding the anisotropic conductive film to the electronic component.

Area occupancy rate (%)=[number density of conductive particles in a plan view (particles/mm$^2$)]×[average area of one conductive particle in a plan view (mm$^2$/particle)]×100

The area occupancy rate is preferably 35% or less, more preferably is in a range of 0.3 to 30% from the viewpoint of suppressing the thrust required for the pressing jig for thermocompression bonding the anisotropic conductive film to the electronic component.

Particle Diameter of Conductive Particle

The particle diameter of the conductive particles is preferably 1 µm or more and 30 µm or less, and more preferably 3 µm or more and 9 µm or less in order to cope with variations in wiring height, to suppress an increase in conduction resistance, and to suppress occurrence of a short circuit. The particle diameter of the conductive particles before being distributed in the insulating resin layer can be measured by a general particle size distribution measuring apparatus. The particle diameter of the conductive particles after being distributed in the insulating resin layer can also be determined using a particle size distribution measuring apparatus. The apparatus may be of an image type or a laser type. A wet flow-type particle size/shape analyzer FPIA-3000 (Malvern Panalytical Ltd) may be mentioned as an example of the image-type measuring apparatus. The number of samples for measuring the average particle diameter D of the conductive particles is preferably 1000 or more. The average particle diameter D of the conductive particles in the anisotropic conductive film can be obtained from observation with an electron microscope such as SEM. In this case, it is desirable to set the number of samples for measuring the average particle diameter D of the conductive particles (the number of conductive particles) to 200 or more.

Note that, when a conductive particle having insulating fine particles attached to its surface is used as the conductive particle, the particle diameter of the conductive particle in the present invention means the particle diameter not including such insulating fine particles on the surface.

Proportion by Number of Conductive Particles Present in a Non-Contact State

In the anisotropic conductive film 10A used for producing the first connection structure 40A, it is preferable that the conductive particles 1 be present without being in contact with each other in a plan view of the film. Therefore, the proportion by number of the conductive particles 1 present in a non-contact state with each other with respect to the entire conductive particles is 95% or more, preferably 98% or more, and more preferably 99.5% or more. As will be described later, it is preferable to regularly dispose the conductive particles 1 by using a transfer mold because the proportion of the conductive particles 1 present in a non-contact state with each other can be easily controlled. When the conductive particles 1 overlap with each other in a plan view, they are counted individually.

Positions of the Conductive Particles in the Film Thickness Direction

Figure 7:
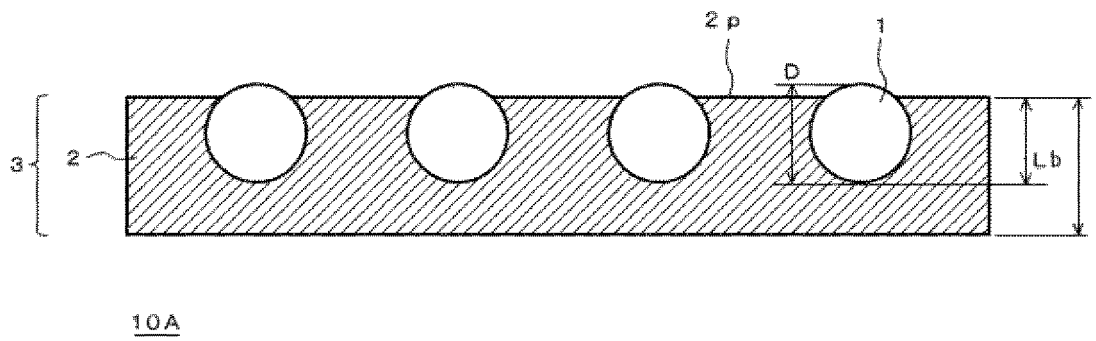
FIG. 7 is a cross-sectional view of an anisotropic conductive film 10A used for producing a connection structure.

In the anisotropic conductive film 10A used for producing the first connection structure 40A, when the conductive particles 1 are present without being in contact with each other, it is preferable that the positions of the conductive particles 1 in the film thickness direction be aligned. For example, as shown in FIG. 7, the embedded amount Lb of the conductive particles 1 in the film thickness direction may be made aligned. As a result, the conductive particle capturing properties tend to be stabilized between the terminal of the first electronic component 31 and the terminal of the third electronic component 33 as well as between the terminal of the second electronic component 32 and the terminal of the third electronic component 33. In the anisotropic conductive film 10A, the conductive particles 1 may be exposed from the insulating resin layer 2 or completely embedded.

Here, the embedded amount Lb refers to a distance between the surface of the insulating resin layer 2 in which the conductive particles 1 are embedded (of the front and back surfaces of the insulating resin layer 2, the surface on the side where the conductive particles 1 are exposed, or the surface close to the conductive particles 1 when the conductive particles 1 are completely embedded in the insulating resin layer 2), in particular, the tangent plane 2p to the center portion between the neighboring conductive particles, and the deepest portion of the conductive particles 1.

Embedded Rate

When the ratio of the embedded amount Lb to the average particle diameter D of the conductive particles 1 is defined as an embedded rate (Lb/D), the embedded rate is preferably 30% or more and 105% or less. When the embedded rate (Lb/D) is 30% or more and less than 60%, the ratio of the conductive particles exposed from the relatively high-viscosity resin holding the conductive particles increases, and thus this facilitates the low-pressure mounting. When the embedded rate is 60% or more, the predetermined particle distributed state or predetermined arrangement of the conductive particles 1 can be easily maintained by the insulating resin layer 2. When the embedded rate is 105% or less, the amount of the resin in the insulating resin layer which acts to cause the conductive particles between the terminals to flow unnecessarily at the time of anisotropic conductive connection can be reduced. The conductive particles 1 may penetrate the insulating resin layer 2 with the embedded rate (Lb/D) of 100%.

Note that the numerical value of the embedded rate (Lb/D) means that 80% or more, preferably 90% or more, more preferably 96% or more of the total number of conductive particles contained in the anisotropic conductive film have the embedded rate (Lb/D) of that numerical value. Therefore, the embedded rate of 30% or more and 105% or less means that the embedded rate of 80% or more, preferably 90% or more, more preferably 96% or more, of the total number of conductive particles contained in the anisotropic conductive film is 30% or more and 105% or less. Since the embedded rate (Lb/D) of all the conductive particles is uniform in this manner, the load of the pressing force is uniformly applied to the conductive particles, so that the conductive particle capturing state at the terminals becomes favorable, and the conduction stability is improved.

(Insulating Resin Layer)

Viscosity of Insulating Resin Layer

In the anisotropic conductive film 10A used for producing the first connection structure 40A, the minimum melt viscosity of the insulating resin layer 2 is not particularly limited, and can be appropriately determined according to the use target of the anisotropic conductive film, the production method of the anisotropic conductive film, and the like. For example, as long as concave portions 2b (FIG. 8) and 2c (FIG. 9), which will be described later, can be formed, the minimum melt viscosity can be set to about 1000 Pa·s depending on the production method of the anisotropic conductive film. On the other hand, when a method of holding the conductive particles in a predetermined disposition on the surface of the insulating resin layer and pushing the conductive particles into the insulating resin layer is performed as the production method of the anisotropic conductive film, it is preferable to set the minimum melt viscosity of the insulating resin layer to 1100 Pa·s or more from the viewpoint of enabling film formation of the insulating resin layer.

Figure 8:
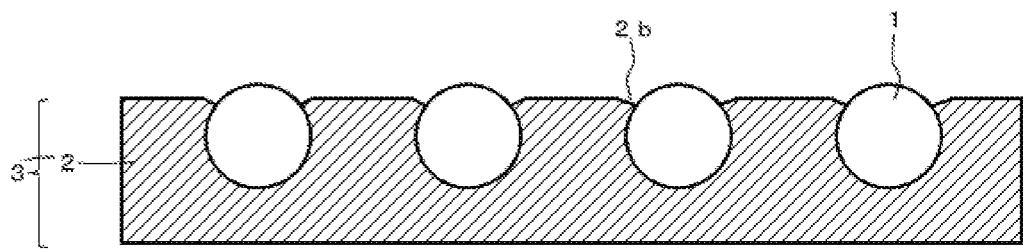
FIG. 8 is a cross-sectional view of the anisotropic conductive film 10A used for producing a connection structure.
Figure 9:
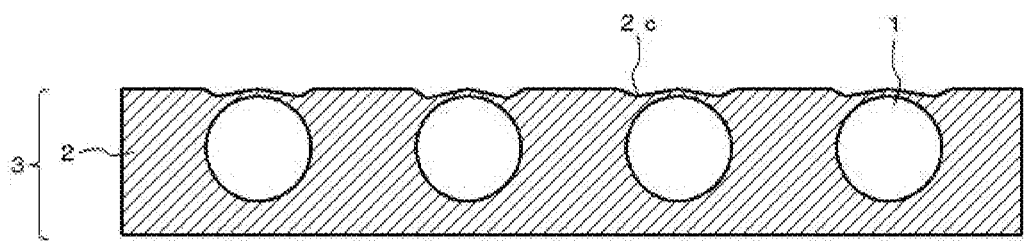
FIG. 9 is a cross-sectional view of the anisotropic conductive film 10A used for producing a connection structure.

In addition, as will be described later in the production method of the anisotropic conductive film, the minimum melt viscosity is preferably 1500 Pa·s or more, more preferably 2000 Pa·s or more, further preferably 3000 to 15000 Pa·s, and still further preferably 3000 to 10000 Pa·s from the viewpoint of forming concave portions 2b around the exposed parts of the conductive particles 1 pushed into the insulating resin layer 2 as shown in FIG. 8 and forming concave portions 2c right above the conductive particles 1 pushed into the insulating resin layer 2 as shown in FIG. 9. The minimum melt viscosity can be determined by using, for example, a rotary rheometer (manufactured by TA Instruments), maintaining the measurement pressure being constant at 5 g, and using a measurement plate having a diameter of 8 mm. More specifically, it can be determined by setting the rate of temperature increase to 10° C./min, the measurement frequency to 10 Hz, and the load variation to 5 g with respect to the measurement plate in a temperature range of 30 to 200° C.

When the minimum melt viscosity of the insulating resin layer 2 is set to a high viscosity of 1500 Pa·s or more, unnecessary movement of the conductive particles at the time of pressure bonding of the anisotropic conductive film to the article can be suppressed. In particular, it is possible to prevent the conductive particles to be held between the terminals at the time of anisotropic conductive connection from flowing by the resin flow.

Further, when the conductive particle distributed layer 3 of the anisotropic conductive film 10A is formed by pushing the conductive particles 1 into the insulating resin layer 2, the insulating resin layer 2 at the time of pushing the conductive particles 1 thereinto is a viscous material having a high viscosity such that the insulating resin layer 2 is plastically deformed to form concave portions 2b (FIG. 8) in the insulating resin layer 2 around the conductive particles 1 when the conductive particles 1 are pushed into the insulating resin layer 2 so as to be exposed from the insulating resin layer 2, or is a viscous material having a high viscosity such that concave portions 2c (FIG. 9) are formed in the surface of the insulating resin layer 2 right above the conductive particles 1 when the conductive particles 1 are pushed into the insulating resin layer 2 to be embedded without being exposed from the insulating resin layer 2. Therefore, the lower limit of the viscosity of the insulating resin layer 2 at 60° C. is preferably 3000 Pa·s or more, more preferably 4000 Pa·s or more, and further preferably 4500

Pa·s or more, and the upper limit thereof is preferably 20000 Pa·s or less, more preferably 15000 Pa·s or less, and further preferably 10000 Pa·s or less. This measurement is performed by the same measurement method as that for the minimum melt viscosity, and the viscosity can be obtained by extracting a value at a temperature of 60° C.

The specific viscosity of the insulating resin layer 2 at the time of pushing the conductive particles 1 thereinto is determined according to the shape and depth of the concave portions 2b or 2c to be formed, or the like, and the lower limit thereof is preferably 3000 Pa·s or more, more preferably 4000 Pa·s or more, and further preferably 4500 Pa·s or more, and the upper limit thereof is preferably 20000 Pa·s or less, more preferably 15000 Pa·s or less, and further preferably 10000 Pa·s or less. Such a viscosity is preferably exhibited at 40 to 80° C., more preferably at 50 to 60° C.

As described above, the formation of the concave portions 2b (FIG. 8) around the conductive particles 1 exposed from the insulating resin layer 2 reduces the resistance received from the insulating resin due to the flattening of the conductive particles 1 that occurs when the anisotropic conductive film is pressure bonded to an article, compared to the case where there is no concave portion 2b. Therefore, the conductive particles are easily held between the terminals at the time of anisotropic conductive connection, so that the conduction performance and also the capturing properties are improved.

In addition, since the concave portions 2c (FIG. 9) are formed in the surface of the insulating resin layer 2 right above the conductive particles 1 which are embedded without being exposed from the insulating resin layer 2, the pressure at the time of pressure bonding of the anisotropic conductive film to an article tends to concentrate on the conductive particles 1 compared to the case where there is no concave portion 2c. Therefore, the conductive particles are easily held between the terminals at the time of anisotropic conductive connection, so that the capturing properties are improved and the conduction performance is improved.

<"Inclination" or "Undulation" Instead of Concave Portion>

The "concave portion" 2b and 2c of the anisotropic conductive film as shown in FIGS. 8 and 9 can also be described in terms of "inclination" or "undulation". A description thereof will next be given with reference to FIGS. 13 to 20.

Figure 13:
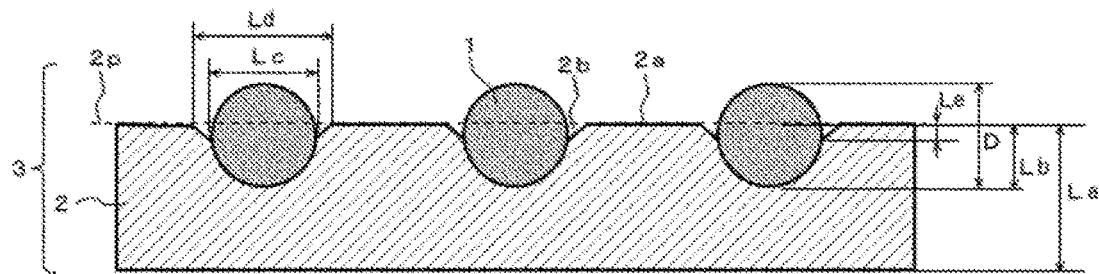
FIG. 13 is a cross-sectional view of the anisotropic conductive film 10A used for producing a connection structure.

The anisotropic conductive film 10A is constituted of a conductive particle distributed layer 3 (FIG. 13). In the conductive particle distributed layer 3, the conductive particles 1 are regularly distributed in a state where they are exposed from one surface of the insulating resin layer 2. In a plan view of the film, the conductive particles 1 are not in contact with each other, and the conductive particles 1 are regularly distributed without overlapping with each other in the film thickness direction, so that they constitute a single conductive particle layer in which the positions of the conductive particles 1 in the film thickness direction are aligned.

Figure 16:
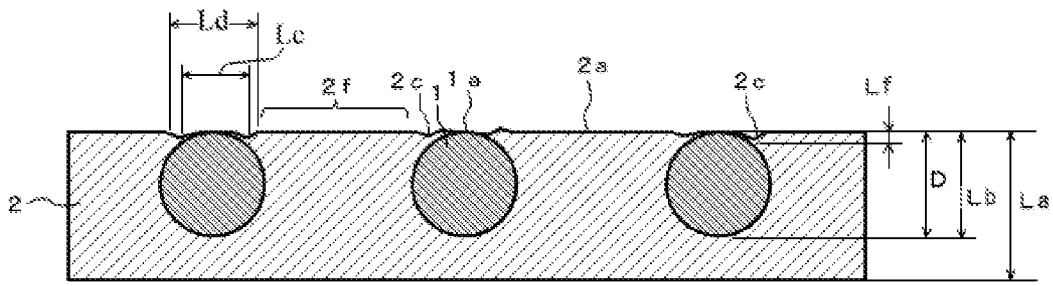
FIG. 16 is a cross-sectional view of an anisotropic conductive film 10D.
Figure 18:
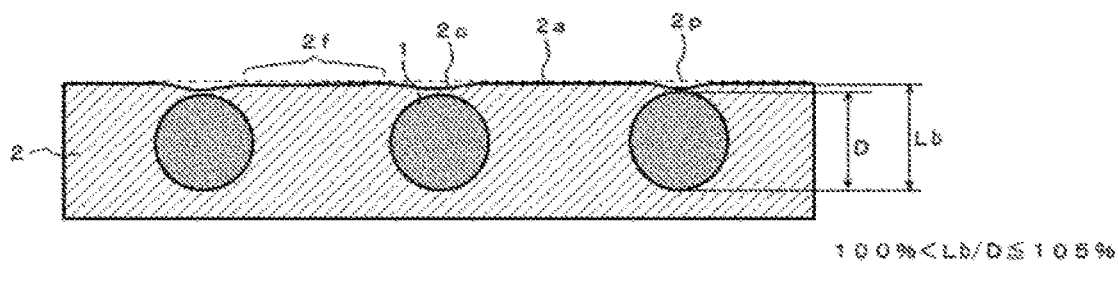
FIG. 18 is a cross-sectional view of an anisotropic conductive film 10F.

An inclination 2b is formed on the surface 2a of the insulating resin layer 2 around each conductive particle 1 with respect to the tangent plane 2p of the insulating resin layer 2 to the center portion between adjacent conductive particles. As will be described later, in the anisotropic conductive film of the present invention, an undulation 2c may be formed on the surface of the insulating resin layer right above the conductive particle 1 embedded in the insulating resin layer 2 (FIG. 16 and FIG. 18).

The term "inclination" used in the present invention means a state in which the flatness of the surface of the insulating resin layer is impaired near the conductive particle 1, and a part of the resin layer is lacked with respect to the tangent plane 2p to reduce the resin amount thereby. In other words, the surface of the insulating resin layer around the conductive particle in the inclination is lacked with respect to the tangent plane. On the other hand, the term "undulation" used herein means a state in which a waviness is generated on the surface of the insulating resin layer right above the conductive particle, and the resin is reduced by the presence of a portion with a height difference such as a waviness. In other words, the amount of the resin in the insulating resin layer right above the conductive particle is smaller than that when the surface of the insulating resin layer right above the conductive particle is flush with the tangent plane. These can be seen by comparing the portions of the flat surfaces (2f in FIG. 16 and FIG. 18) between the conductive particles with the portions corresponding to the position right above the conductive particles. It should be noted that the starting point of the undulation may be present as an inclination.

As described above, the formation of the inclination 2b (FIG. 13) around the conductive particle 1 exposed from the insulating resin layer 2 reduces the resistance received from the insulating resin due to the flattening of the conductive particle 1 that occurs when the conductive particle 1 is held between the terminals at the time of anisotropic conductive connection, compared to the case where there is no inclination 2b. Thus, since the conductive particles are easily held by the terminals, the conduction performance and also the capturing properties are improved. The inclination preferably follows the contour of the conductive particles. This is because, in addition to the fact that the effect in connection is more likely to be exhibited, it becomes easier to carry out a test or the like in the production of the anisotropic conductive film by making it easier to recognize the conductive particles. The inclination and undulation may be partially lost by heat pressing the insulating resin layer, but the present invention encompasses this case. In this case, the conductive particle may be exposed at one point on the surface of the insulating resin layer. There are various electronic components to be connected by the anisotropic conductive film, and as long as tuning is performed according to these, it is desired that the degree of freedom of design be high so as to satisfy various requirements. Therefore, the anisotropic conductive film can be used even if the inclination or undulation is reduced or partially disappeared.

In addition, since the undulation 2c (FIG. 16 and FIG. 18) is formed on the surface of the insulating resin layer 2 right above the conductive particle 1 which is embedded without being exposed from the insulating resin layer 2, the pressing force from the terminals tends to be applied to the conductive particle at the time of the anisotropic conductive connection, similarly to the case of the inclination. In addition, since the amount of the resin right above the conductive particle is reduced due to the presence of the undulation compared with the case where the resin is deposited flat, the resin right above the conductive particle is easily removed at the time of connection, and the terminals and the conductive particle easily come into contact with each other, so that the conductive particle capturing properties at the terminals are improved, and the conduction reliability is improved.

(Positions of Conductive Particles in the Thickness Direction of the Insulating Resin Layer)

Although the positions of the conductive particles 1 in the thickness direction of the insulating resin layer 2 when considering the viewpoint of "inclination" or "undulation" may be such that the conductive particles 1 are exposed from the insulating resin layer 2, or may be embedded in the insulating resin layer 2 without being exposed, as described above, it is preferable that the ratio (Lb/D) (embedded rate) of the distance Lb (hereinafter referred to as the embedded amount) of the deepest portion of the conductive particles from the tangent plane $2p$ to the center portion between adjacent conductive particles to the average particle diameter D of the conductive particles be 30% or more and 105% or less.

When the embedded rate (Lb/D) is 30% or more and less than 60%, the ratio of the particles exposed from the relatively high-viscosity resin holding the conductive particles increases, and thus this facilitates the low-pressure mounting. When the embedded rate is 60% or more, the predetermined particle distributed state or predetermined arrangement of the conductive particles 1 can be easily maintained by the insulating resin layer 2. When the embedded rate is 105% or less, the amount of the resin in the insulating resin layer which acts to cause the conductive particles between the terminals to flow unnecessarily at the time of anisotropic conductive connection can be reduced.

Note that the numerical value of the embedded rate (Lb/D) means that 80% or more, preferably 90% or more, more preferably 96% or more of the total number of conductive particles contained in the anisotropic conductive film have the embedded rate (Lb/D) of that numerical value. Therefore, the embedded rate of 30% or more and 105% or less means that the embedded rate of 80% or more, preferably 90% or more, more preferably 96% or more, of the total number of conductive particles contained in the anisotropic conductive film is 30% or more and 105% or less. Since the embedded rate (Lb/D) of all the conductive particles is uniform in this manner, the load of the pressing force is uniformly applied to the conductive particles, so that the conductive particle capturing state at the terminals becomes favorable, and the conduction stability is improved.

The embedded rate (Lb/D) can be determined by arbitrarily extracting 10 or more areas having an area of 30 mm$^2$ or more from the anisotropic conductive film, observing a part of a cross section of the film with the use of SEM images, and measuring 50 or more conductive particles. In order to improve the precision, 200 or more conductive particles may be measured to determine the embedded rate.

The measurement of the embedded rate (Lb/D) may be determined collectively for a certain number of particles by adjusting the focus in the surface field images.

Alternatively, a laser type discrimination sensor (manufactured by Keyence Corporation or the like) may be used for measuring the embedded rate (Lb/D).

(Aspect of Embedded Rate of 30% or More and Less than 60%)

As a more specific embedded aspect of the conductive particles 1 having an embedded rate (Lb/D) of 30% or more and less than 60%, an aspect may be mentioned in which the conductive particles 1 are embedded at an embedded rate of 30% or more and less than 60% such that the conductive particles 1 are exposed from the insulating resin layer 2 as in the anisotropic conductive film 10A shown in FIG. 13. The anisotropic conductive film 10A has inclinations $2b$ in which portions of the surface of the insulating resin layer 2 in contact with the conductive particles 1 exposed from the insulating resin layer 2 and the vicinity thereof become ridge lines substantially along the outer shapes of the conductive particles with respect to the tangent plane $2p$ in the surface $2a$ of the insulating resin layer to the center portion between the adjacent conductive particles.

When the anisotropic conductive film 10A is produced by pushing the conductive particles 1 into the insulating resin layer 2, the inclinations $2b$ or the undulations $2c$ described later can be formed by pushing the conductive particles 1 into the insulating resin layer 2 at 40 to 80° C. at 3000 to 20000 Pa·s, more preferably 4500 to 15000 Pa·s.

(Aspect of Embedded Rate of 60% or More and Less than 100%)

As a more specific embedded aspect of the conductive particles 1 having an embedded rate (Lb/D) of 60% or more and 105% or less, an aspect may be mentioned in which the conductive particles 1 are embedded at an embedded rate of 60% or more and less than 100% such that the conductive particles 1 are exposed from the insulating resin layer 2 as in the anisotropic conductive film 10A shown in FIG. 13. The anisotropic conductive film 10A has inclinations $2b$ in which portions of the surface of the insulating resin layer 2 in contact with the conductive particles 1 exposed from the insulating resin layer 2 and the vicinity thereof become ridge lines substantially along the outer shapes of the conductive particles with respect to the tangent plane $2p$ in the surface $2a$ of the insulating resin layer to the center portion between the adjacent conductive particles.

When the anisotropic conductive film 10A is produced by pushing the conductive particles 1 into the insulating resin layer 2, the inclinations $2b$ or the undulations $2c$ described below are formed such that the lower limit of the viscosity at the time of pushing the conductive particles 1 is preferably 3000 Pa·s or more, more preferably 4000 Pa·s or more, and further preferably 4500 Pa·s or more, and the upper limit thereof is preferably 20000 Pa·s or less, more preferably 15000 Pa·s or less, and further preferably 10000 Pa·s or less. Such a viscosity is preferably exhibited at 40 to 80° C., and more preferably at 50 to 60° C. Note that the inclinations $2b$ or the undulations $2c$ may be partially lost by heat pressing the insulating resin layer, the inclinations $2b$ may be transformed to the undulations $2c$, and the conductive particles embedded in the insulating resin layer having the undulations $2c$ may be exposed from the insulating resin layer 2 at one point on the top thereof.

(Aspect of Embedded Rate of 100%)

Figure 14:
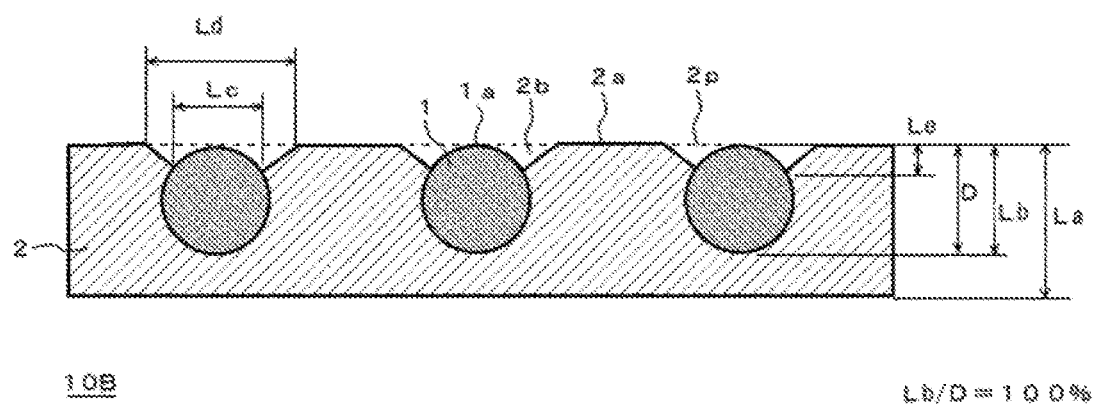
FIG. 14 is a cross-sectional view of the anisotropic conductive film 10B.
Figure 15A:
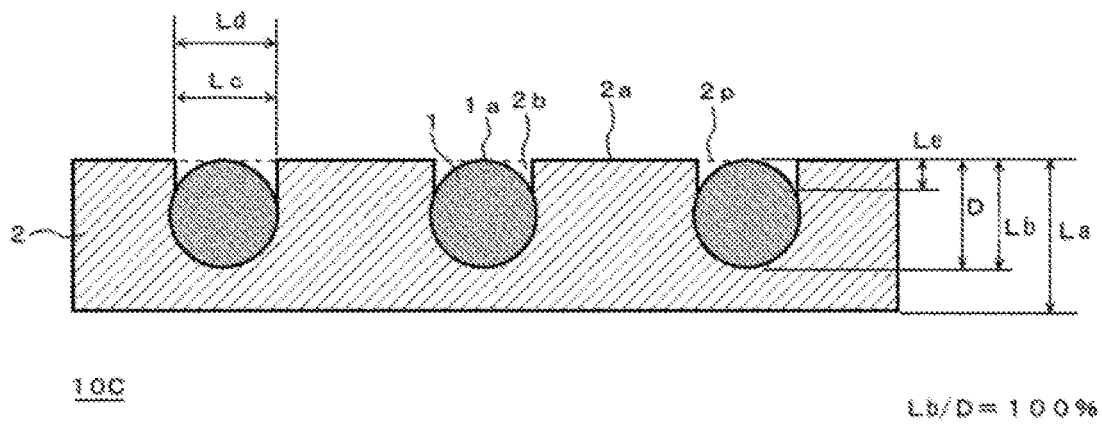
FIG. 15A is a cross-sectional view of an anisotropic conductive film 10C.

Next, as an aspect of the anisotropic conductive film of the present invention having an embedded rate (Lb/D) of 100%, there may be mentioned: an aspect like that of the anisotropic conductive film 10B shown in FIG. 14 which has inclinations $2b$ around the conductive particles 1 which become ridge lines substantially along the outer shapes of the conductive particles similar to the anisotropic conductive film 10A shown in FIG. 13, and the exposed diameter Lc of the conductive particles 1 exposed from the insulating resin layer 2 is smaller than the average particle diameter D of the conductive particles; an aspect like that of the anisotropic conductive film 10C shown in FIG. 15A in which inclinations $2b$ around the exposed portions of the conductive particles 1 appear abruptly near the conductive particles 1 and the exposed diameter Lc of the conductive particles 1 is substantially equal to the average particle diameter D of the conductive particles; and an aspect like that of the anisotropic conductive film 10D shown in FIG. 16 in which the surface of the insulating resin layer 2 has undulations $2c$, and the conductive particles 1 are exposed from the insulating resin layer 2 at one point on the top $1a$ thereof.

Figure 15B:
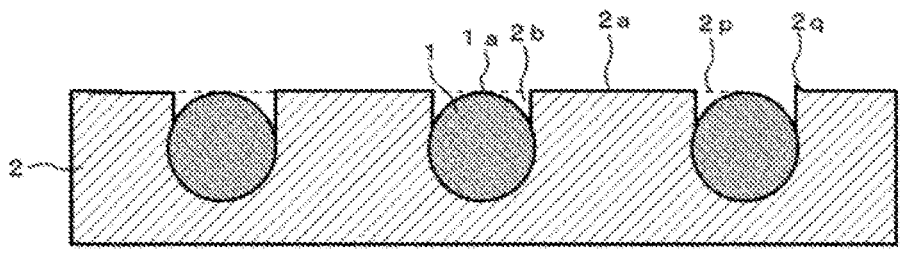
FIG. 15B is a cross-sectional view of an anisotropic conductive film 10C'.

In addition, a minute protruding portion $2q$ may be formed in the inclinations $2b$ of the insulating resin layer 2 around the exposed portions of the conductive particles or in the vicinity of the undulations 2c of the insulating resin layer right above the conductive particles. One example thereof is shown in FIG. 15B.

Since these anisotropic conductive films 10B, 10C, 10C', and 10D have an embedded rate of 100%, the top 1a of the conductive particle 1 and the surface 2a of the insulating resin layer 2 are flush with each other. When the top 1a of the conductive particle 1 and the surface 2a of the insulating resin layer 2 are flush with each other, the amount of the resin in the film thickness direction is unlikely to be uneven around each of the conductive particles at the time of anisotropic conductive connection as compared with the case where the conductive particles 1 protrude from the insulating resin layer 2 as shown in FIG. 13. Thus, there is an effect that the movement of the conductive particles due to the resin flow can be reduced. Even when the embedded rate is not strictly 100%, this effect can be obtained if the top portion of the conductive particles 1 embedded in the insulating resin layer 2 and the surface of the insulating resin layer 2 are flush with each other. In other words, when the embedded rate (Lb/D) is approximately 80 to 105%, particularly 90 to 100%, the top portion of the conductive particles 1 embedded in the insulating resin layer 2 and the surface of the insulating resin layer 2 can be considered as being flush with each other, and thus the movement of the conductive particles due to the resin flow can be reduced.

Among these anisotropic conductive films 10B, 10C, 10C', and 10D, since the amount of the resin around the conductive particles 1 does not easily become uneven, the anisotropic conductive film 10D can prevent the movement of the conductive particles due to the resin flow. Furthermore, since the conductive particles 1 are exposed from the insulating resin layer 2 even at one point on the top 1a thereof, the conductive particle 1 capturing properties at the terminals are good, and it is expected to provide the effect in that the slight movement of the conductive particles is unlikely to occur. Therefore, this aspect is effective particularly when the fine pitch is adopted or the inter-bump space is narrow.

The anisotropic conductive films 10B (FIG. 14), 10C (FIG. 15A), 10C' (FIG. 15B), and 10D (FIG. 16), which differ in the shapes and depths of the inclination 2b and the undulation 2c, can be produced by changing the viscosity or the like of the insulating resin layer 2 when the conductive particles 1 are pushed in, as will be described later.

(Aspect of Embedded Rate Exceeding 100%)

Figure 17:
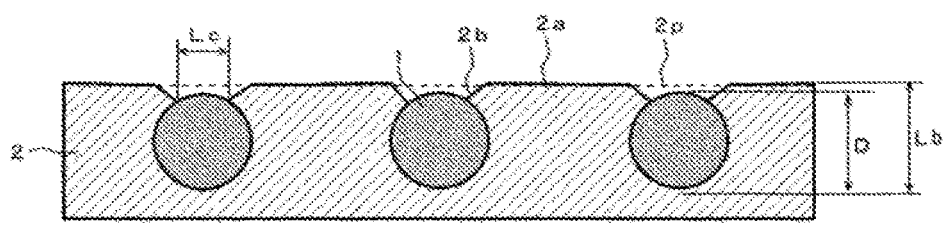
FIG. 17 is a cross-sectional view of an anisotropic conductive film 10E.

In the case of those having an embedded rate exceeding 100% among the anisotropic conductive films of the present invention, an aspect may be mentioned in which the conductive particles 1 are exposed as in the anisotropic conductive film 10E shown in FIG. 17 and inclinations 2b around the exposed parts thereof with respect to the tangent plane 2p, or an aspect may also be mentioned in which undulations 2c on the surface of the insulating resin layer 2 right above the conductive particles 1 with respect to the tangent plane 2p are present as in the anisotropic conductive film 10F shown in FIG. 18.

Note that the anisotropic conductive film 10E (FIG. 17) having inclinations 2b in the insulating resin layer 2 around the exposed portions of the conductive particles 1 and the anisotropic conductive film 10F (FIG. 18) having undulations 2c in the insulating resin layer 2 right above the conductive particles 1 can be produced by changing the viscosity or the like of the insulating resin layer 2 when the conductive particles 1 are pushed in at the time of producing these.

When the anisotropic conductive film 10E shown in FIG. 17 is used for the anisotropic conductive connection, the conductive particles 1 are directly pressed from the terminal, so that the conductive particle capturing properties at the terminals are improved. When the anisotropic conductive film 10F shown in FIG. 18 is used for anisotropic conductive connection, the conductive particles 1 do not directly press the terminals but press the terminals through the insulating resin layer 2. In this case, the amount of the resin existing in the pressing direction is smaller than that in the state shown in FIG. 20 (i.e., the state in which the conductive particles 1 are embedded with an embedded rate exceeding 100%, the conductive particles 1 are not exposed from the insulating resin layer 2, and the surface of the insulating resin layer 2 is flat). Therefore, the pressing force tends to be applied to the conductive particles, and the conductive particles 1 between the terminals are prevented from moving unnecessarily by the resin flow at the time of anisotropic conductive connection.

From the viewpoint of facilitating the effects of the inclinations 2b (FIGS. 13, 14, 15A, 15B, and 17) of the insulating resin layer 2 around the exposed portions of the conductive particles described above and the undulations 2c (FIGS. 16 and 18) of the insulating resin layer right above the conductive particles, the ratio (Le/D) of the maximum depth Le of the inclination 2b to the average particle diameter D of the conductive particles 1 is preferably less than 50%, more preferably less than 30%, and further preferably 20% to 25%, the ratio (Ld/D) of the maximum diameter Ld of the inclination 2b or the undulation 2c to the average particle diameter D of the conductive particles 1 is preferably 100% or more, and more preferably 100% to 150%, and the ratio (Lf/D) of the maximum depth Lf of the undulation 2c to the average particle diameter D of the conductive particles 1 is more than zero, preferably less than 10%, and more preferably 5% or less.

The diameter Lc of the exposed (right above) part of the conductive particle 1 in the inclination 2b or the undulation 2c can be equal to or smaller than the average particle diameter D of the conductive particle 1, and is preferably 10 to 90% of the average particle diameter D. The conductive particles 1 may be exposed at one point at the top of the conductive particles 1, or the conductive particles 1 may be completely embedded in the insulating resin layer 2 so that the diameter Lc becomes zero.

Figure 19:
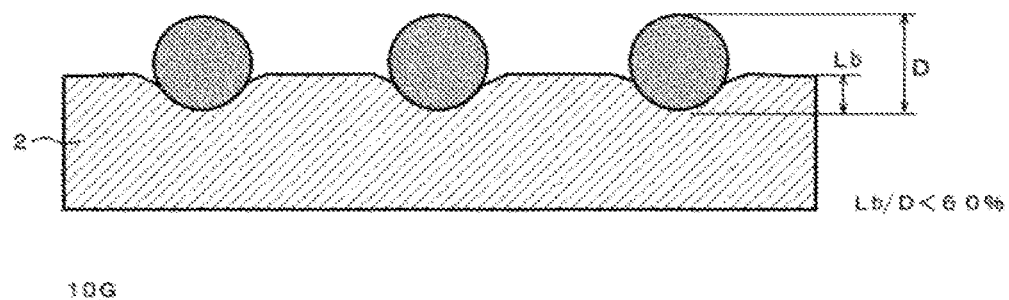
FIG. 19 is a cross-sectional view of an anisotropic conductive film 10G.

Note that, as shown in FIG. 19, since the conductive particles 1 easily roll on the insulating resin layer 2 in the anisotropic conductive film 10G having the embedded rate (Lb/D) of less than 60%, it is preferable to set the embedded rate (Lb/D) to 60% or more from the viewpoint of improving the capturing rate at the time of anisotropic conductive connection.

Figure 20:
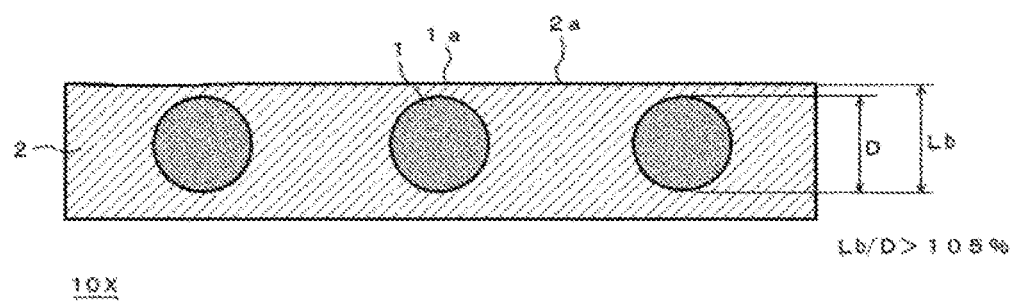
FIG. 20 is a cross-sectional view of an anisotropic conductive film 10X as a comparative object.

In addition, in the aspect in which the embedded rate (Lb/D) exceeds 100%, when the surface of the insulating resin layer 2 is flat as in the anisotropic conductive films 10X of the comparative example shown in FIG. 20, the amount of the resin interposed between the conductive particles 1 and the terminals becomes excessively large. In addition, since the conductive particles 1 press the terminals via the insulating resin without being in direct contact with, and pressing, the terminal, the conductive particles are also easily flowed by the resin flow.

In the present invention, the presence of the inclination 2b and the undulation 2c on the surface of the insulating resin layer 2 can be confirmed by observing a cross section of an anisotropic conductive film with a scanning electron microscope, and can also be confirmed by surface field observation. The inclination 2b and the undulation 2c can also be observed by an optical microscope or a metallurgical microscope. Further, the size of the inclination 2b and the undulation 2c can be confirmed by adjusting the focus at the time of observing images. The same operation can be applied to the cases even after the inclination or undulation is reduced by the heat press as described above. This is because traces may remain.

(Composition of Insulating Resin Layer)

The insulating resin layer 2 can be formed of a curable resin composition, for example, a thermo-polymerizable composition containing a thermo-polymerizable compound and a thermal polymerization initiator. The thermo-polymerizable composition may contain a photopolymerization initiator as necessary.

When a thermal polymerization initiator and a photopolymerization initiator are used in combination, a thermo-polymerizable compound which also functions as a photopolymerizable compound may be used as the thermo-polymerizable compound, or a photopolymerizable compound may be contained separately from the thermo-polymerizable compound. A photopolymerizable compound is preferably contained separately from the thermo-polymerizable compound. For example, a thermal cationic polymerization initiator is used as the thermal polymerization initiator, an epoxy compound is used as the thermo-polymerizable compound, a photoradical polymerization initiator is used as the photopolymerization initiator, and an acrylate compound is used as the photopolymerizable compound.

As the photopolymerization initiator, a plurality of types thereof which react with light having different wavelengths may be contained. As a result, it is possible to selectively use wavelengths used for light curing of the resin constituting the insulating resin layer at the time of producing the anisotropic conductive film and for light curing of the resin for bonding the electronic components to each other at the time of anisotropic conductive connection.

In the photocuring at the time of producing the anisotropic conductive film, all or part of the photopolymerizable compound contained in the insulating resin layer can be photocured. By this photocuring, the disposition of the conductive particles 1 in the insulating resin layer 2 is held or fixed, so that the suppression of short-circuiting and the improvement of the capturing properties are expected. In addition, the viscosity of the insulating resin layer in the production process of the anisotropic conductive film may be appropriately adjusted by this photocuring. In particular, the photocuring is preferably performed when the ratio (La/D) between the layer thickness La of the insulating resin layer 2 and the average particle diameter D of the conductive particles 1 is less than 0.6. This is because, even when the layer thickness of the insulating resin layer 2 is thin with respect to the average particle diameter of the conductive particles, the disposition of the conductive particles is more reliably held or fixed by the insulating resin layer 2, and the viscosity of the insulating resin layer 2 is adjusted to suppress a decrease in yield in connection between electronic components using the anisotropic conductive film.

The mixed amount of the photopolymerizable compound in the insulating resin layer is preferably 30% by mass or less, more preferably 10% by mass or less, and further preferably less than 2% by mass. This is because too much an amount of the photopolymerizable compound increases the thrust of pushing-in applied at the time of connection.

Examples of the thermo-polymerizable composition may include a thermal radical polymerizable acrylate-based composition containing a (meth)acrylate compound and a thermal radical polymerization initiator, and a thermal cationic polymerizable epoxy-based composition containing an epoxy compound and a thermal cationic polymerization initiator. Instead of the thermal cationic polymerizable epoxy-based composition containing the thermal cationic polymerization initiator, a thermal anionic polymerizable epoxy-based composition containing a thermal anionic polymerization initiator may be used. Furthermore, a plurality of types of polymerizable compounds may be used in combination as long as they do not cause any particular problem. Examples of the combination may include a combination of a cationic polymerizable compound and a radical polymerizable compound.

As the (meth)acrylate compound, a conventionally known thermo-polymerizable (meth)acrylate monomer can be used. For example, monofunctional (meth)acrylate-based monomers, bifunctional or polyfunctional (meth)acrylate-based monomers may be used.

Examples of the thermal radical polymerization initiator may include an organic peroxide, and an azo compound. In particular, an organic peroxide which does not generate nitrogen which causes bubbles may preferably be used.

The amount of the thermal radical polymerization initiator used is preferably 2 to 60 parts by mass, and more preferably 5 to 40 parts by mass, with respect to 100 parts by mass of the (meth)acrylate compound, since too small an amount of the thermal radical polymerization initiator leads to poor curing and too large an amount of the thermal radical polymerization initiator leads to a decrease in product life.

Examples of the epoxy compound may include a bisphenol A type epoxy resin, a bisphenol F type epoxy resin, a novolac type epoxy resin, modified epoxy resins of these, and an alicyclic epoxy resin. Two or more types of these resins may be used in combination. In addition to the epoxy compound, an oxetane compound may be used in combination.

As the thermal cationic polymerization initiator, any known thermal cationic polymerization initiator for an epoxy compound may be adopted, and examples thereof used may include an iodonium salt, a sulfonium salt, a phosphonium salt, and a ferrocene, which generate an acid by heat. In particular, an aromatic sulfonium salt which exhibits good latency with respect to temperature may preferably be used.

The amount of the thermal cationic polymerization initiator used is preferably 2 to 60 parts by mass, and more preferably 5 to 40 parts by mass, with respect to 100 parts by mass of the epoxy compound, since too small an amount of the thermal cationic polymerization initiator tends to cause poor curing, and too large an amount thereof tends to lower the product life.

The thermo-polymerizable composition preferably contains a film forming resin or a silane coupling agent. Examples of the film forming resin may include a phenoxy resin, an epoxy resin, an unsaturated polyester resin, a saturated polyester resin, a urethane resin, a butadiene resin, a polyimide resin, a polyamide resin, and a polyolefin resin, and two or more of these resins may be used in combination. Of these, a phenoxy resin may preferably be used from the viewpoints of film forming property, processability, and connection reliability. The weight-average molecular weight is preferably 10000 or more. Examples of the silane coupling agent may include an epoxy-based silane coupling agent, and an acrylic silane coupling agent. These silane coupling agents are primarily alkoxysilane derivatives.

In order to adjust the melt viscosity, the thermo-polymerizable composition may contain insulating conductive particles in addition to the conductive particles 1 described above. Examples of the insulating conductive particles may include silica powder and alumina powder. Fine conductive particles having an insulating conductive particle diameter of 20 to 1000 nm is preferable, and the mixed amount is preferably 5 to 50 parts by mass with respect to 100 parts by mass of a thermo-polymerizable compound (photopolymerizable compound) such as an epoxy compound.

The anisotropic conductive film of the present invention may contain a filling agent, a softener, an accelerator, an antiaging agent, a colorant (pigment, dye), an organic solvent, an ion catcher agent, or the like, in addition to the above-mentioned insulating conductive particles.

(Layer Thickness of Insulating Resin Layer)

In the anisotropic conductive film 10A used for producing the first connection structure 40A, the layer thickness of the insulating resin layer 2 is not particularly limited because it varies depending on the average particle diameter D of the conductive particles 1 and the terminal heights of the first electronic component 31, the second electronic component 32, and the third electronic component 33; however, as an example, when the average particle diameter D is less than 10 μm, the ratio (La/D) of the layer thickness La of the insulating resin layer 2 and the average particle diameter D of the conductive particles 1 is preferably 0.3 or more and 10 or less, more preferably 3 or less, and further preferably 1 or less. From the viewpoint of maintaining the disposition of the conductive particles 1 in the insulating resin layer 2, the ratio (La/D) is more preferably 0.4 or more. Further, from the viewpoint of suppressing excessive resin flow at the time of anisotropic conductive connection and realizing low-pressure mounting, the ratio is preferably 1 or less. Further, from the viewpoints of facilitating the exposure of the conductive particles 1 from the insulating resin layer 2 and facilitating the low-pressure mounting, the ratio (La/D) is preferably less than 1, more preferably less than 0.6, and further preferably 0.5 or less. When the La/D is 3 or less, it may be preferable to provide a second insulating resin layer 4 having a lower minimum melt viscosity than that in the insulating resin layer 2.

On the other hand, when the average particle diameter D is 10 μm or more, the upper limit of the La/D is set to 3.5 or less, preferably 2.5 or less, and more preferably 2 or less, and the lower limit thereof is set to 0.8 or more, preferably 1 or more, and more preferably 1.3 or more.

In addition, if the layer thickness La of the insulating resin layer 2 is too large and the ratio (La/D) becomes excessively large regardless of the size of the average particle diameter D, it becomes difficult for the conductive particles 1 to be pressed against the terminals at the time of anisotropic conductive connection, and the conductive particles are easily flowed by the resin flow. Therefore, the conductive particles are easily displaced, and the conductive particle capturing properties at the terminals are lowered. In addition, the thrust required for the pressing jig to press the conductive particles against the terminals also increases, which hinders the low-pressure mounting. On the contrary, when the layer thickness La of the insulating resin layer 2 is too small and the ratio becomes excessively small, it becomes difficult for the insulating resin layer 2 to maintain the conductive particles 1 in a predetermined position.

(Second Insulating Resin Layer)

Figure 10:
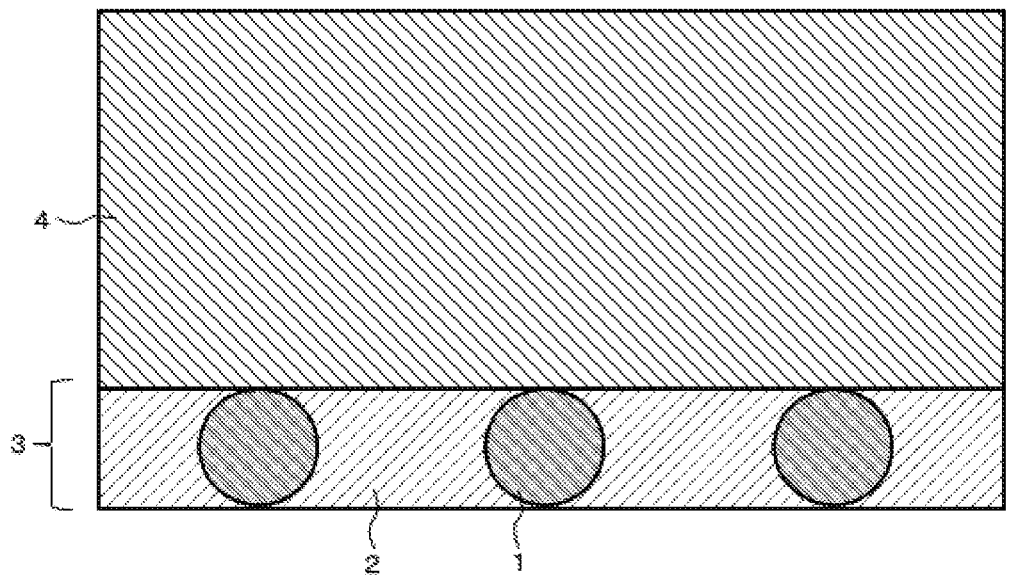
FIG. 10 is a cross-sectional view of the anisotropic conductive film 10A used for producing a connection structure.
Figure 11:
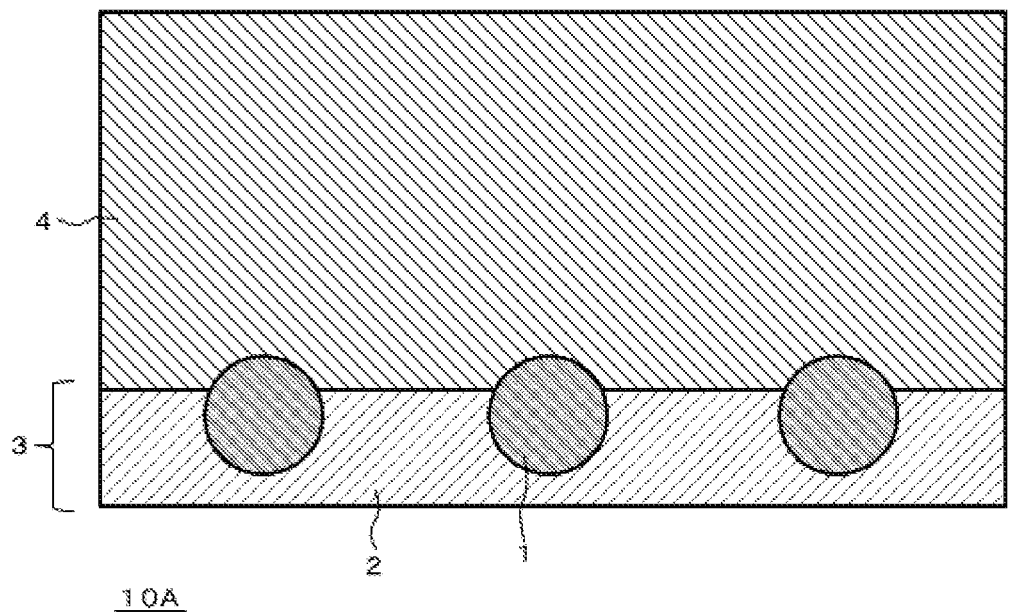
FIG. 11 is a cross-sectional view of the anisotropic conductive film 10A used for producing a connection structure.
Figure 12:
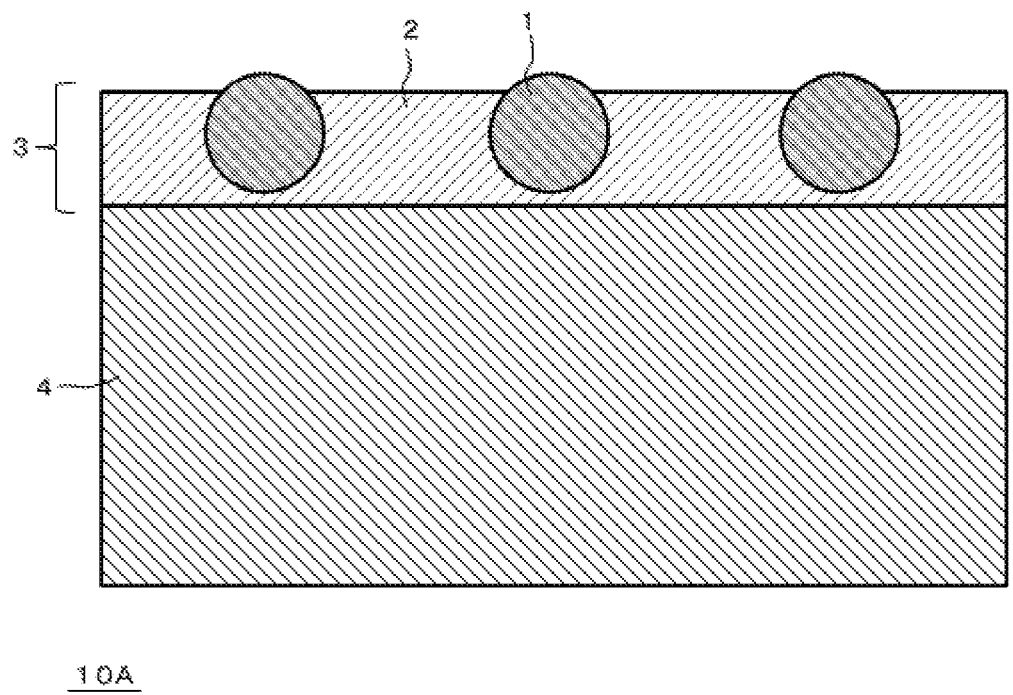
FIG. 12 is a cross-sectional view of the anisotropic conductive film 10A used for producing a connection structure.

In the anisotropic conductive film 10A, a second insulating resin layer 4 having a lower minimum melt viscosity than that of the insulating resin layer 2 may be laminated on the insulating resin layer 2 (FIG. 10 to FIG. 12). The second insulating resin layer 4 fills a space formed by terminals such as bumps of electronic components at the time of anisotropic conductive connection, and can improve adhesion properties between the opposing electronic components. That is, in order to enable low-pressure mounting of the electronic component using the anisotropic conductive film and to improve the particle capturing properties by suppressing the resin flow of the insulating resin layer 2 at the time of anisotropic conductive connection, it is desirable to increase the viscosity of the insulating resin layer 2 and to reduce the thickness of the insulating resin layer 2 as long as the conductive particles 1 do not cause positional displacement. If the thickness of the insulating resin layer 2 is excessively reduced, however, there is a concern that the adhesion properties may be lowered because the amount of the resin for adhering the opposing electronic components to each other may be short. On the other hand, provision of the second insulating resin layer 4 having a viscosity lower than that of the insulating resin layer 2 at the time of anisotropic conductive connection can improve the adhesion properties between electronic components, and can make it difficult to prevent the conductive particles from being held or pushed in by the terminals due to the high fluidity of the second insulating resin layer 4.

When the second insulating resin layer 4 is laminated on the conductive particle distributed layer 3, it is preferable that the second insulating resin layer 4 is affixed to the electronic component to be pressed by a tool (the insulating resin layer 2 is affixed to the electronic component to be placed on the stage) regardless of whether or not the second insulating resin layer 4 is on the surface on which the concave portions 2b are formed. By doing so, unnecessary movement of the conductive particles can be avoided, and the capturing properties can be improved.

The larger the difference in the minimum melt viscosity ratio between the insulating resin layer 2 and the second insulating resin layer 4 becomes, the more easily the space formed by the electrodes and bumps of the electronic component is filled with the second insulating resin layer 4. Thus, the adhesion properties between the electronic components can be improved. Further, the larger the difference becomes, the less the relative amount of movement of the insulating resin present in the conductive particle distributed layer 3 becomes. Thus, it is difficult for the conductive particles 1 between the terminals to be flowed by the resin flow, so that the conductive particle capturing properties at the terminals are improved. In practical use, the minimum melt viscosity ratio between the insulating resin layer 2 and the second insulating resin layer 4 is preferably 2 or more, more preferably 5 or more, and further preferably 8 or more. On the other hand, if this ratio is too large, when a long-length anisotropic conductive film is formed into a wound body, there is a concern that the resin may run off or be blocked, and therefore, it is practically preferable that the ratio be 15 or less. More specifically, the preferable minimum melt viscosity of the second insulating resin layer 4 satisfies the above-described ratio and is 3000 Pa·s or less, more preferably 2000 Pa·s or less, and particularly preferably 100 to 2000 Pa·s.

The second insulating resin layer 4 can be formed by adjusting the viscosity in the same resin composition as that for the insulating resin layer 2.

The layer thickness of the second insulating resin layer 4 is preferably 4 to 20 Alternatively, it is preferably 1 to 8 times the conductive particle diameter, specifically, the average particle diameter thereof.

The minimum melt viscosity of the entire anisotropic conductive film containing the insulating resin layer 2 and the second insulating resin layer 4 in combination is 8000 Pa·s or less, preferably 200 to 7000 Pa·s, and particularly preferably 200 to 4000 Pa·s.

As a specific lamination aspect of the second insulating resin layer 4, for example, the second insulating resin layer 4 can be laminated on one surface of the conductive particle distributed layer 3, as shown in FIG. 10. In this case, the relationship between the average particle diameter D of the conductive particles 1 and the layer thickness La of the insulating resin layer 2 is set such that La/D is 0.3 or more and 10 or less as described above.

As shown in FIG. 11, when the conductive particles 1 protrude from one surface of the insulating resin layer 2, the second insulating resin layer 4 may be laminated on the protruding surface so that the conductive particles 1 bite the second insulating resin layer 4. If the embedded rate of the conductive particles 1 is 0.95 or less, it is preferable to laminate the second insulating resin layer 4 in this manner, and if the embedded rate is 0.9 or less, it is more preferable to do so.

As shown in FIG. 12, the second insulating resin layer 4 may be laminated on the surface opposite to the surface of the insulating resin layer 2 in which the conductive particles 1 are embedded.

(Third Insulating Resin Layer)

A third insulating resin layer may be provided on the opposite side to the second insulating resin layer 4 with the insulating resin layer 2 interposed therebetween. The third insulating resin layer can function as a tack layer. As in the second insulating resin layer 4, the third insulating resin layer may be provided to fill a space formed by electrodes and bumps of an electronic component.

The resin composition, viscosity, and thickness of the third insulating resin layer may be the same as or different from those of the second insulating resin layer. The minimum melt viscosity of the anisotropic conductive film containing the insulating resin layer 2, the second insulating resin layer 4, and the third insulating resin layer in combination is not particularly limited, but may be 200 to 4000 Pa·s.

(Method for Producing Anisotropic Conductive Film 10A)

As a method for producing the anisotropic conductive film 10A, for example, the conductive particles 1 are held on the surface of the insulating resin layer 2 in a predetermined regular arrangement, and are pushed into the insulating resin layer 2 with a flat plate or a roller.

Here, the embedded amount Lb of the conductive particles 1 in the insulating resin layer 2 can be adjusted by pressing pressure, temperature, etc. when the conductive particles 1 are pushed in, and the presence or absence, shape, and depth of the concave portions 2b and 2c can be adjusted by the viscosity of the insulating resin layer 2, pushing speed, temperature, etc. when the conductive particles are pushed in.

The technique of holding the conductive particles 1 in the insulating resin layer 2 is not particularly limited, and for example, a transfer mold is used to hold the conductive particles 1 in the insulating resin layer 2. As the transfer mold, for example, those obtained by forming openings in a transfer mold material of an inorganic material such as silicon, various ceramics, glass, or a metal such as stainless steel, or an organic material such as various resins by a known opening forming method such as a photolithography method can be used. The transfer mold may have a plate shape, a roll shape, or the like.

In order to economically connect electronic components using an anisotropic conductive film, it is preferable that the anisotropic conductive film has a certain length. Therefore, the anisotropic conductive film is produced to have a length of preferably 5 m or more, more preferably 10 m or more, and further preferably 25 m or more. On the other hand, if the anisotropic conductive film is excessively long, it becomes impossible to use a conventional connection device used when producing an electronic component using the anisotropic conductive film, and handling performance also deteriorates. Therefore, the anisotropic conductive film is produced to have a length of preferably 5000 m or less, more preferably 1000 m or less, and further preferably 500 m or less. Such a long body of the anisotropic conductive film is preferably a wound body wound around a winding core from the viewpoint of excellent handleability.

(Method for Producing First Connection Structure)

As the method for producing the first connection structure 40A, when the anisotropic conductive film 10A is composed of a single layer of the conductive particle distributed layer 3, the anisotropic conductive film is temporarily attached to a third electronic component 33 such as various substrates from the side where the conductive particles 1 are embedded in the surface thereof and temporarily compression bonded, the temporarily compression bonded anisotropic conductive film is attached to the first electronic component 31 such as an IC chip from the side where the conductive particles 1 of the anisotropic conductive film are not embedded in the surface and thermally compression bonded, and the second electronic component 32 such as an FPC is attached thereto and thermally compression bonded. In this case, the first electronic component 31 and the second electronic component 32 may be simultaneously pressure bonded from the sides of the first electronic component 31 and the second electronic component 32 by a pressure tool, or they may be separately compression bonded by a pressure tool.

When the insulating resin layer of the anisotropic conductive film contains not only a thermal polymerization initiator and a thermo-polymerizable compound but also a photopolymerization initiator and a photopolymerizable compound (which may be the same as the thermo-polymerizable compound), a pressure bonding method using both light and heat may be used instead of thermal compression bonding. In this manner, unnecessary movement of the conductive particles can be minimized. Alternatively, the side where the conductive particles are not embedded may be temporarily attached to the third electronic component 33. Instead of the third electronic component, the anisotropic conductive film may be temporarily attached to the first electronic component and the second electronic component.

Further, when the anisotropic conductive film 10A is formed from a laminate of the conductive particle distributed layer 3 and the second insulating resin layer 4, the conductive particle distributed layer 3 is temporarily attached to the third electronic component 33 such as various substrates and is temporarily pressure bonded, and the first electronic component 31 such as an IC chip and the second electronic component 32 such as an FPC are aligned and mounted on the second insulating resin layer 4 side of the temporarily pressure bonded anisotropic conductive film, followed by thermocompression bonding. The anisotropic conductive film 10A may be temporarily attached to the first electronic component 31 or the second electronic component 32 from the second insulating resin layer 4 side thereof. In addition, the anisotropic conductive film 10A may be temporarily attached to the first electronic component 31 or the second electronic component 32 from the conductive particle distributed layer 3 side thereof.

[Second Connection Structure]

(Overall Configuration)

Figure 4A:
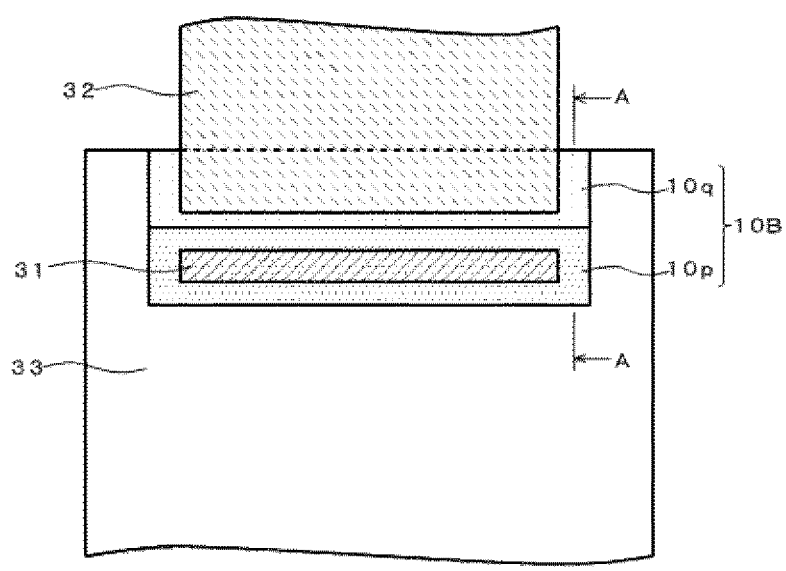
FIG. 4A is a schematic plan view of a second connection structure 40B of the present invention.

FIG. 4A is a schematic plan view of a second connection structure 40B among the aspects of the connection structures of the present invention, and FIGS. 4B, 4C, 4D, and 4E are examples of schematic cross-sectional views of anisotropic conductive films of the second connection structure 40B. In this second connection structure 40B, a first electronic component 31 having a first terminal pattern and a second electronic component 32 having a second terminal pattern different in size and pitch from the first terminal pattern are anisotropically conductively connected to a third electronic component 33 having a terminal pattern corresponding to each of the first terminal pattern and the second terminal pattern by the anisotropic conductive film 10B. However, this second connection structure 40B is different from the first connection structure 40A in that an anisotropic conductive film 10B used for producing the second connection structure 40B has a plurality of regions 10p and 10q having at least one of the number density of conductive particles, the particle diameter, and the hardness in one region different from that in the other region. As a result, it is possible to perform a more suitable connection to each of the first electronic component 31 and the second electronic component 32 than that with the first connection structure 40A, and useless conductive particles can be further reduced.

Also in the second connection structure 40B, the number and disposition of the first electronic component 31 and the second electronic component 32 connected to the third electronic component 33 are not particularly limited, similarly to those in FIGS. 2 and 3 showing the first connection structure 40A.

Figure 5A:
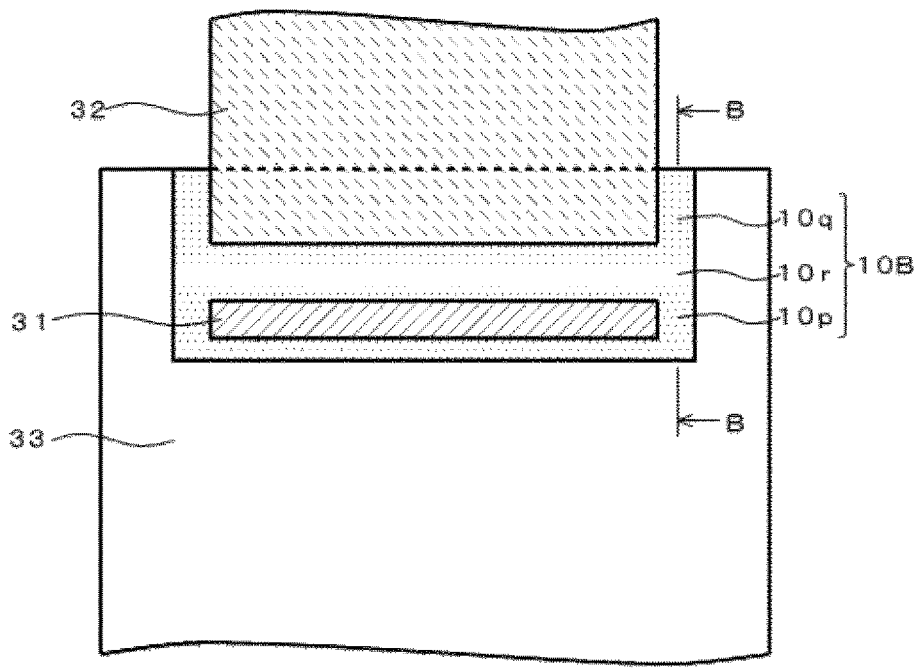
FIG. 5A is a schematic plan view of the second connection structure 40B of the present invention.
Figure 5B:
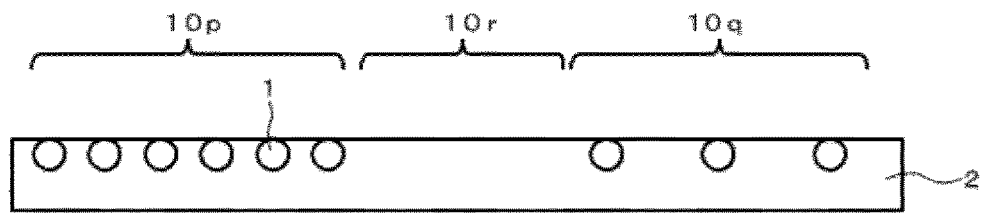
FIG. 5B is a cross-sectional view of the anisotropic conductive film 10B used in the second connecting structure 40B of the present invention.
Figure 5C:
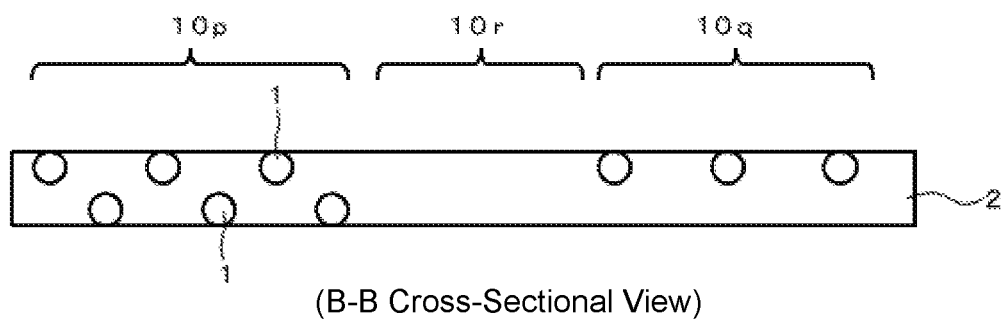
FIG. 5C is a cross-sectional view of the anisotropic conductive film 10B used in the second connecting structure 40B of the present invention.
Figure 6A:
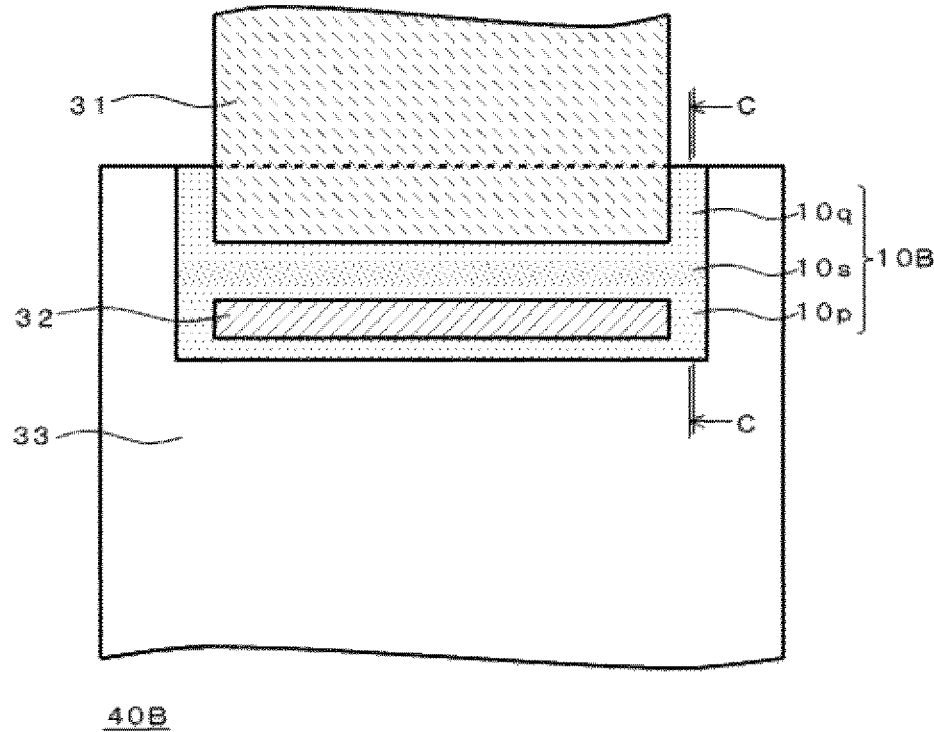
FIG. 6A is a schematic plan view of the second connection structure 40B of the present invention.
Figure 6B:
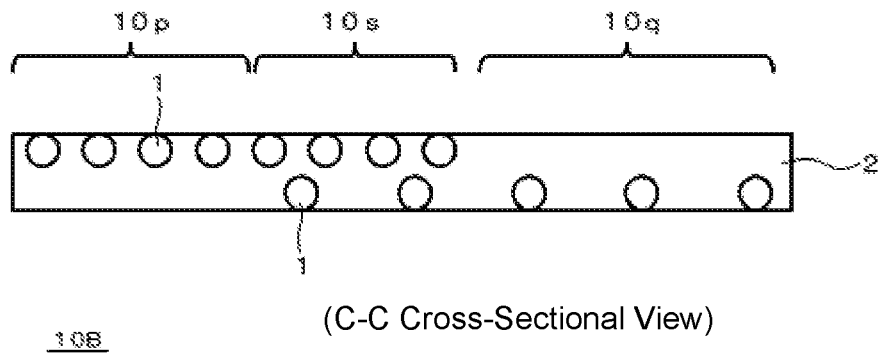
FIG. 6B is a cross-sectional view of the anisotropic conductive film 10B used in the second connecting structure 40B of the present invention.

In the second connecting structures 40B, the regions 10p and 10q of the anisotropic conductive films 10B differing in at least one of the number density, the particle diameter, and the hardness of the conductive particles may adjoin each other as shown in FIG. 4A, and the regions 10p and 10q may be disposed via a region 10r in which the conductive particles do not exist as shown in FIG. 5A. FIG. 5B and FIG. 5C are examples of schematic cross-sectional views of anisotropic conductive film portions of the second connecting structures 40B shown in FIG. 5A. As shown in FIG. 6A, the region 10p and the region 10q may be disposed via a region 10s in which the number density of conductive particles is higher than those in the region 10p and the region 10q. FIG. 6B is an example of a schematic cross-sectional view of the anisotropic conductive film portion of the second connecting structure 40B shown in FIG. 6A. In addition, a plurality of regions in which at least one of the number density, the particle diameter, and the hardness of the conductive particles in one region is different from that in the other region may be disposed in the short-side direction of the film as shown in the above-mentioned FIG. 4A and the like, or may be disposed in the long-side direction of the film. In this case, it is preferable that the anisotropic conductive film has a region in which the positions of the conductive particles in the thickness direction of the insulating resin layer are aligned on or near one surface of the insulating resin layer, and a region in which the positions of the conductive particles in the thickness direction of the insulating resin layer are aligned both on or near one surface of the insulating resin layer and on or near the other surface thereof.

(Anisotropic Conductive Film in Second Connection Structure)

As a more specific configuration of the anisotropic conductive film 10B used for producing the second connecting structure, for example, when the first electronic component 31 and the third electronic component 33 are COG-connected, the number density of the conductive particles in the region 10p of the anisotropic conductive film 10B is 7000 particles/mm$^2$ or more and 35000 particles/mm$^2$ or less, or the particle diameter of the conductive particles is 2 μm or more and 9 μm or less, or the 20% compressive elastic modulus (20% K value) is 4000 N/mm$^2$ or more and 28000 N/mm$^2$ or less, preferably 4000 N/mm$^2$ or more and 20000 N/mm$^2$ or less, as the hardness of the conductive particles. On the other hand, when the second electronic component 32 and the third electronic component 33 are FOG-connected, the number density of the conductive particles in the region 10q of the anisotropic conductive film 10B is 50 particles/mm$^2$ or more and 10000 particles/mm$^2$ or less, or the particle diameter of the conductive particles is 2 μm or more and 30 μm or less, or the 20% compressive elastic modulus (20% K value) is 2000 N/mm$^2$ or more and 18000 N/mm$^2$ or less, as the hardness of the conductive particles.

Although various numerical values in the connection region of the first electronic component 31 and the third electronic component 33 and the connection region of the second electronic component 32 and the third electronic component 33 overlap with each other in the above description, the numerical values are designed and used so as not to overlap with each other in the above-described respective ranges. For example, if the number density of the conductive particles in the region where the first electronic component 31 and the third electronic component 33 are COG-connected is 8000 particles/mm$^2$, the number density of the conductive particles in the region where the second electronic component 32 and the third electronic component 33 are FOG-connected may be less than 8000 particles/mm$^2$, and preferably set to 6000 particles/mm$^2$ or less by providing a difference of 20% or more for easy discrimination. The same applies to other parameters.

Here, as the 20% compressive elastic modulus, the compressive variable quantity of the conductive particles when a compressive load is applied to the conductive particles is measured using a micro compression tester (for example, Fisher Scope H-100 manufactured by Fisher Instruments K.K.).

$$20\% \text{ compressive elastic modulus } (K) \text{ (N/mm}^2) = (3/2^{1/2}) \cdot F \cdot S^{-3/2} \cdot R^{-1/2}$$

Then, the K value calculated by the foregoing formula can be used.

In the formula, the symbols mean as follows:

F: load value (N) when the conductive particles are compressively deformed by 20%, S: compressive displacement (mm) when the conductive particles are compressively deformed by 20%, and R: radius of the conductive particle (mm).

In the region 10p and the region 10q, which of the number density, the particle diameter, and the hardness of the conductive particles is made different is appropriately determined according to the first electronic component 31 and the second electronic component 32 to be connected, and is preferably determined according to the number density. This is because the use of the same conductive particles can avoid contamination in terms of design (unintentional mixing of different types of conductive particles) and thus is preferable from the viewpoint of quality control. Therefore, the conductive particles present on at least one surface side preferably have the same particle diameter, and more preferably have the same particle diameter and hardness.

Figure 4B:
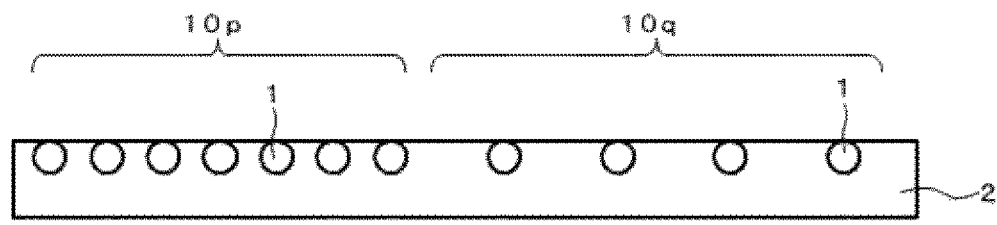
FIG. 4B is a cross-sectional view of an anisotropic conductive film 10B used in the second connecting structure 40B of the present invention.
Figure 4C:
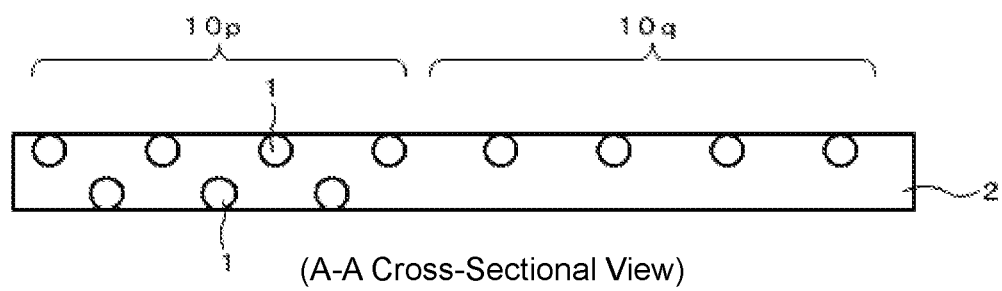
FIG. 4C is a cross-sectional view of the anisotropic conductive film 10B used in the second connecting structure 40B of the present invention.
Figure 4D:
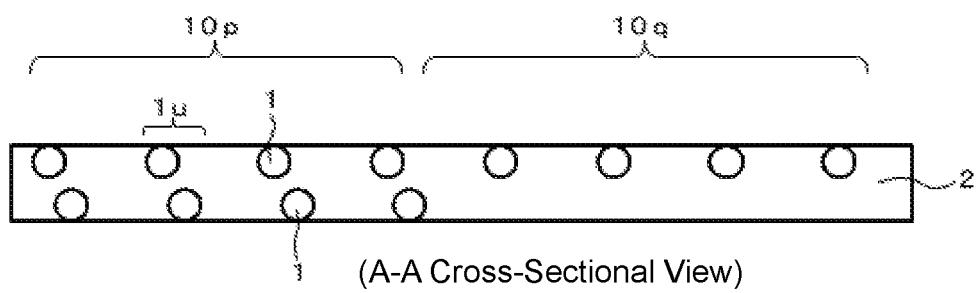
FIG. 4D is a cross-sectional view of the anisotropic conductive film 10B used in the second connecting structure 40B of the present invention.
Figure 4E:
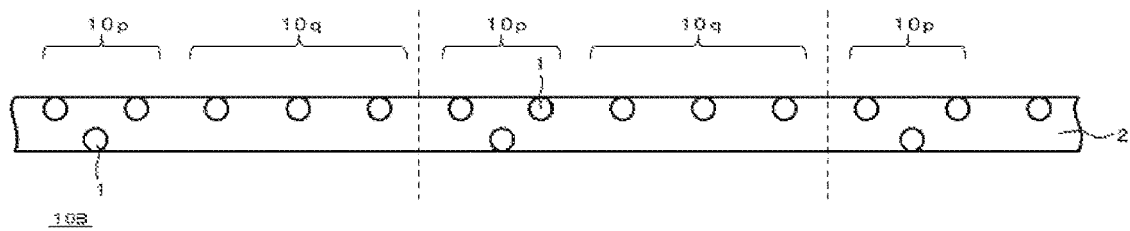
FIG. 4E is a cross-sectional view of the anisotropic conductive film 10B used in the second connecting structure 40B of the present invention.

Further, for example, when the number density of the conductive particles is made different in the region 10p and in the region 10q, the region 10p and the region 10q may be formed by making the number density of the conductive particles 1 near one surface of the insulating resin layer 2 different as shown in FIG. 4B, and the region 10p and the region 10q in which the number densities of the conductive particles are different from each other may be formed by combining the conductive particles 1 in both the front and back surfaces of the insulating resin layer 2, as shown in FIG. 4C, FIG. 4D, and FIG. 4E. In this case, as shown in FIG. 4D, the conductive particles 1 on the front and back sides of the insulating resin layer 2 may overlap with each other in a plan view to form a conductive particle unit 1u, and the conductive particle units may be regularly arranged.

In the anisotropic conductive film 10B used for producing the second connection structure 40B, the configuration of the conductive particles themselves, the configuration of the insulating resin layer 2, the configuration of the second insulating resin layer 4, and the like can be the same as those of the anisotropic conductive film 10A used for producing the first connection structure 40A.

The anisotropic conductive film 10B used for the production of the second connection structure 40B can also be produced according to the method for producing anisotropic conductive film 10A used for the production of the first connection structure 40A. For example, the conductive particles 1 for forming the region 10p are held on one surface of the insulating resin layer 2, and the conductive particles 1 are pushed into the insulating resin layer 2 by a flat plate or a roller (first pushing step). Then, the conductive particles 1 for forming the region 10p, or the region 10p and the region 10q are held on the one surface of the insulating resin layer 2 into which the conductive particles have been pushed first or the surface opposite thereto, and the conductive particles are pushed into the insulating resin layer by a flat plate or a roller (second pushing step). In this case, the conductive particles 1 pushed in the second pushing step may form part of the region into which the conductive particles 1 have been pushed in the first pushing step (FIG. 4C, FIG. 4D) in a plan view, may form a region containing the entire region into which the conductive particles 1 have been pushed in the first pushing step (FIG. 4E), or may form a region that partially overlaps with the region into which the conductive particles 1 have been pushed in the first pushing step (FIG. 6B). Depending on the particle disposition of the conductive particles 1, the transfer mold used for attaching the conductive particles 1 to the insulating resin layer 2 in the first pushing step may be used for attaching the conductive particles 1 to the insulating resin layer 2 in the second pushing step as well (FIG. 5C). This is preferable because the production cost of the anisotropic conductive film can be reduced. In this case, the conductive particles 1 can be attached to one surface or the other surface of the insulating resin layer 2.

Particle diameters and hardnesses of the conductive particles to be pushed in in the first pushing step and the conductive particles to be pushed in in the second pushing step may be the same as or different from each other as necessary. The arrangement of the conductive particles to be pushed in in the first pushing step and the arrangement of the conductive particles to be pushed in in the second pushing step may be different from each other, and the number density of the conductive particles to be pushed in in the first pushing step and the number density of the conductive particles to be pushed in in the second pushing step may be different from each other.

Generally, when an anisotropic conductive film is produced in a wound body, a wide anisotropic conductive film is slit into a predetermined width to form a strip-shaped film, and the slit anisotropic conductive film is wound around a winding core; however, for example, in the anisotropic conductive film 10B shown in FIG. 4E, the number densities of conductive particles near both the front and back surfaces of the insulating resin layer 2 are different from each other while the densities are uniform, and the anisotropic conductive film is slit at the positions of the broken lines to form the strip-shaped anisotropic conductive films, so that the region 10p and the region 10q can be formed. As a result, the region 10p and the region 10q in which the number densities are different from each other can be easily formed.

For the same reason as described above, it is preferable that the number density of the conductive particles on one side in the direction perpendicular to the long-side direction of the film be different from that on the side opposite to the one side. For production reasons, it is preferable that the number density, the particle diameter, and the hardness of the conductive particles on one surface of the film are different from those on the surface opposite to the one surface. At this time, it is more preferable that the interparticle distance of the conductive particles be different on either one of the surface opposite to the one of the surfaces of the film.

EXAMPLE

A description for the present invention will now be specifically given by way of examples.

Examples 1 to 7 and Comparative Examples 1 and 2

(1) Production of Anisotropic Conductive Film

A resin composition for forming an insulating resin layer, which forms a conductive particle distributed layer, and a resin composition for forming a second insulating resin layer were prepared by the formulations shown in Table 1, respectively. The minimum melt viscosity of the insulating resin layer was 3000 Pa·s or more, and the ratio of the minimum melt viscosity of the insulating resin layer to the minimum melt viscosity of the second insulating resin layer was 2 or more.

The resin composition for forming the insulating resin layer (high viscosity resin layer) was applied onto a PET film having a film thickness of 50 μm by a bar coater, and dried in an oven at 80° C. for 5 minutes, so that an insulating resin layer having a thickness shown in Table 2 was formed on the PET film. In the same manner, the second insulating resin layer was formed on the PET film with the thickness shown in Table 2.

TABLE 1

| | Formulation | Parts by mass |
|---|---|---|
| Insulating Resin Layer (High Viscosity Resin) | Phenoxy Resin (Nippon Steel & Sumikin Chemical Co., Ltd., YP-50) | 40 |
| | Silica Filler (Nippon Aerosil Co., Ltd., R805) | 25 |
| | Liquid Epoxy Resin (Mitsubishi Chemical Co., Ltd., jER828) | 30 |
| | Silane Coupling Agent (Shin-Etsu Chemical Co., Ltd., KBM-403) | 2 |
| | Thermal Cationic Polymerization Initiator (Sanshin Chemical Industry Co., Ltd., SI-60L) | 3 |
| Second | Phenoxy Resin (Nippon Steel & Sumikin | 40 |

TABLE 1-continued

| | Formulation | Parts by mass |
|---|---|---|
| Insulating Resin Layer | Chemical Co., Ltd., YP-50)<br>Silica Filler (Nippon Aerosil Co., Ltd., R805)<br>Liquid Epoxy Resin (Mitsubishi Chemical Co., Ltd., jER828)<br>Silane Coupling Agent (Shin-Etsu Chemical Co., Ltd., KBM-403)<br>Thermal Cationic Polymerization Initiator (Sanshin Chemical Industry Co., Ltd., SI-60L) | 5<br>50<br><br>2<br><br>3 |

On the other hand, a mold was produced such that the conductive particles (average particle diameter: 3 µm or 4 µm) were arranged in a hexagonal lattice arrangement in a plan view, and the number density (surface density) of the conductive particles in a plan view was the value shown in Table 2. In Table 2, in the case of different surface densities of the conductive particles on the FOG side and the COG side, two regions having different surface densities were formed in one mold. Pellets of a known transparent resin were melted and poured into this mold in a molten state, and cooled and solidified to form a resin mold having a hexagonal lattice arrangement pattern of concave portions.

Conductive particles having an average particle diameter shown in Table 2 (average particle diameter of 3 AUL703 manufactured by Sekisui Chemical Co., Ltd., and average particle diameter of 4 AUL704 manufactured by Sekisui Chemical Co., Ltd.) were filled in the concave portions of the resin mold. The above-described insulating resin layer was placed thereover, and bonded thereto by pressing at 60° C. and 0.5 MPa. Then, the insulating resin layer was peeled off from the mold, and the conductive particles on the insulating resin layer were pushed into the insulating resin layer under (the pressing condition: 60 to 70° C., 0.5 MPa) to form the conductive particle distributed layer (Examples 1 to 7).

In Comparative Examples 1 and 2, conductive particles were mixed with the resin composition forming the insulating resin layer shown in Table 1 to form a conductive particle dispersed layer in which conductive particles were randomly dispersed in a single layer.

Further, a second insulating resin layer was laminated on the surface of the conductive particle distributed/dispersed layer to produce a two-layer type anisotropic conductive film (Examples 1 to 7, Comparative Examples 1 and 2).

The 20% compressive elastic modulus (20% K value) of the conductive particles used was measured using a micro compression tester (for example, Fisher Scope H-100 manufactured by Fisher Instruments K.K.). The results are shown in Table 2.

(2) Evaluation

The anisotropic conductive films of the examples and the comparative examples prepared in (1) were cut to have a sufficient area so as to be applicable to the preparation of the following connection article for evaluation. A part of the cut anisotropic conductive film was disposed between an IC for evaluation and a glass substrate shown below, heated and pressed at 180° C. and 60 MPa and for 5 seconds to achieve anisotropic conductive connection. Then, an FPC for evaluation was connected to the glass substrate by heating and pressing with a tool width of 1.5 mm, at 200° C. and 5 MPa and for 5 seconds using a different region of the same anisotropic conductive film, thereby obtaining a connection article for evaluation in which the IC for evaluation and the FPC for evaluation were anisotropically conductively connected to the glass substrate using one sheet of the anisotropic conductive film.

IC for evaluation:
Outer shape 1.8×30 mm
Thickness 0.5 mm
Bump specification: size 30×85 µm, inter-bump distance 10 µm, bump height 15 µm, number of terminals 820

FPC for Evaluation:
Terminal pitch 20 µm
Terminal width: space between terminals=1:1
Polyimide film thickness/cupper foil thickness (PI/Cu) =38/8, Sn plating Glass Substrate:
(COG Side)
Glass material: 1737F manufactured by Corning Incorporated
Electrode ITO wiring
Wiring thickness 0.5 mm
(FOG Side)
Electrode ITO wiring
Wiring thickness 0.7 mm The (a) conduction resistance, (b) conduction reliability, (c) minimum capturing number, and (d) short circuit rate of the connection article for evaluation thus obtained were measured and evaluated in the following manners. Table 2 shows the results.

(a) Conduction Resistance

The conduction resistances at the COG-side connection portion and the FOG-side connection portion of the connection article for evaluation were measured by a four-terminal method. The conduction resistance is preferably 2Ω or less in practical use.

(b) Conduction Reliability

The connection article for evaluation was placed in a constant temperature bath at a temperature of 85° C. and a humidity of 85% RH for 500 hours, and then the conduction resistances at the COG-side connection portion and the FOG-side connection portion were measured in the same manner as that in the initial conduction resistance. The conduction resistance is preferably 5Ω or less in practical use.

(c) Minimum Capturing Number

The number of captured conductive particles was measured for 100 terminals at each of the COG-side connection portion and the FOG-side connection portion of the connection article for evaluation, and the minimum capturing number was determined and evaluated according to the following criteria. The minimum capturing number is preferably evaluated as B or more in practical use.

Evaluation Criteria for Minimum Capturing Number
A: 10 particles or more
B: 5 particles or more and less than 10 particles
C: 3 particles or more and less than 5 particles
D: less than 3 particles (d) Short Circuit Rate The number of short circuits at each of the COG-side connection portion and the FOG-side connection portion of the connection article for evaluation was measured by the following method, and the short circuit rate was determined as the ratio of the measured number of short circuits to the number of terminals, and evaluated by the following criteria. The short circuit rate is preferably evaluated as B or more in practical use.

Short Circuit Rate at the COG-Side Connection Portion
An IC for evaluation of the short circuit rate as follows was used to obtain a connection article for evaluation on the COG side under the same connection conditions as described above, and the number of short circuits of the obtained connection article for evaluation was measured to determine the short circuit rate as the ratio of the measured number of short circuits to the number of terminals of the IC for evaluation.

IC for evaluation of short circuit rate (Comb teeth TEG (test element group) with a space of 7.5 µm)
Outer shape 15×13 mm
Thickness 0.5 mm
Bump specification: size 25×140 µm, inter-bump distance 7.5 µm, and bump height 15 µm Short Circuit Rate at the FOG-Side Connection Portion The same FPC as the FPC for evaluation used for producing the connection article for evaluation to be used in the test for (a) conduction resistance was connected to a non-alkali glass substrate (thickness: 0.7 mm) under the same connection conditions as described above to obtain a connection article for evaluation on the FOG side, and the number of short circuits of the obtained connection article for evaluation was measured to determine the short circuit rate on the basis of the measured number of short circuits and the number of gaps of the connection article for evaluation.

Short Circuit Rate Evaluation Criterion
A: less than 50 ppm
B: 50 ppm or more and less than 100 ppm
C: 100 ppm or more and less than 200 ppm
D: 200 ppm or more eter, and hardness of the conductive particles in Examples 1, 2, and 3 were different between the FOG-side connection portion and the COG-side connection portion, and it is understood that the conduction reliability at the FOG-side connection portion or the COG-side connection portion in Examples 1, 2, and 3 was improved as compared to those in Examples 4, 5, 6, and 7. On the other hand, in Comparative Examples 1 and 2, the surface density, particle diameter, and hardness of the conductive particles were not different between the FOG-side connection portion and the COG-side connection portion, and the conductive particles were randomly dispersed. Thus, the conduction resistance and conduction reliability of the FOG-side connection portion deteriorated in Comparative Example 1 in which the number density of the conductive particles was high, and the conduction resistance and conduction reliability of the COG-side connection portion deteriorated in Comparative Example 2 in which the number density of the conductive particles was low.

REFERENCE SIGNS LIST 1 conductive particle
2 insulating resin layer
2b concave portion (inclination)
2c concave portion (undulation)
3 conductive particle distributed layer
4 second insulating resin layer

TABLE 2

| | | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Disposition of Conductive Particles | | Hexagonal Lattice | Hexagonal Lattice | Hexagonal Lattice | Hexagonal Lattice | Hexagonal Lattice | Hexagonal Lattice | Hexagonal Lattice | Random | Random |
| Surface Density of Conductive Particles (particles/mm$^2$) | FOG side Connection Portion | 5000 | 5000 | 5000 | 15000 | 15000 | 15000 | 20000 | 60000 | 5000 |
| | COG side Connection Portion | 20000 | 20000 | 20000 | 15000 | 15000 | 15000 | 20000 | 60000 | 5000 |
| Particle Diameter (µm) | FOG side Connection Portion | 4 | 4 | 4 | 4 | 4 | 3 | 3 | 3 | 4 |
| | COG side Connection Portion | 3 | 3 | 3 | 4 | 4 | 3 | 3 | 3 | 4 |
| Particle Hardness (20% K value) | FOG side Connection Portion | 4000 | 5000 | 4000 | 5000 | 4000 | 5000 | 5000 | 5000 | 4000 |
| | COG side Connection Portion | 5000 | 5000 | 4000 | 5000 | 4000 | 5000 | 5000 | 5000 | 4000 |
| FOG side Connection Portion | Conduction Resistance (Ω) | 1.2 | 1.2 | 1.2 | 1.2 | 1.2 | 1.2 | 1.2 | 2.4 | 1.2 |
| | Conduction Reliability 85° C./85% (Ω) | 1.8 | 2.6 | 1.8 | 2.5 | 2.0 | 2.9 | 3.6 | 9.7 | 1.8 |
| | Minimum Capturing Number | A | A | A | A | A | A | A | A | A |
| | Short Circuit Rate | A | A | A | A | A | A | B | D | A |
| COG side Connection Portion | Conduction Resistance (Ω) | 0.2 | 0.2 | 0.4 | 0.2 | 0.2 | 0.2 | 0.2 | 0.2 | 0.6 |
| | Conduction Reliability 85° C./85% (Ω) | 2.4 | 2.2 | 4.5 | 2.3 | 4.8 | 2.2 | 2.2 | 2.4 | 8.9 |
| | Minimum Capturing Number | A | A | A | A | A | A | A | A | D |
| | Short Circuit Rate | A | A | A | A | A | A | A | C | A |

As can be seen from Table 2, the surface density, particle diameter, and hardness of the conductive particles in Examples 4, 5, 6, and 7 were not different at the FOG-side connection portion and at the COG-side connection portion. However, since the conductive particles were regularly arranged, all of the conduction resistance, conduction reliability, capturing number, and short circuit rate were practically allowable. Further, the surface density, particle diam- 10A, 10B, 10C, 10D, 10E, 10F, 10G anisotropic conductive film
10p, 10q, 10r, 10s region of anisotropic conductive film
31 first electronic component
32 second electronic component
33 third electronic component
40A first connection structure
40B second connection structure D average particle diameter of conductive particle
La layer thickness of insulating resin layer
Lb distance between tangent plane to center portion between adjacent conductive particles and deepest portion of conductive particle
Lc diameter of exposed (right above) part of conductive particle at inclination or undulation
Ld maximum diameter of inclination or undulation in insulating resin layer around or right above conductive particle
Le maximum depth of inclination in insulating resin layer around conductive particle
Lf maximum depth of undulation in insulating resin layer right above conductive particle

The invention claimed is:

1. A connection structure including:
an anisotropic conductive film,
a first electronic component having a first terminal pattern,
a second electronic component having a second terminal pattern different in size and pitch from the first terminal pattern,
a third electronic component having a terminal pattern corresponding to each of the first terminal pattern and the second terminal pattern,
wherein:
the first electronic component and the second electronic component are anisotropically conductively connected by the anisotropic conductive film to the third electronic component, and
the anisotropic conductive film has at least one of a region in which conductive particles are regularly arranged, and a plurality of regions in which at least one of a number density, a particle diameter, and a hardness of the conductive particles in one region is different from that in the other region.

2. The connection structure according to claim 1, wherein the anisotropic conductive film has a region in which the conductive particles are regularly arranged and the number density of the conductive particles is less than 35,000 particles/mm$^2$.

3. The connection structure according to claim 1, wherein the anisotropic conductive film has a plurality of regions in which conductive particles are regularly arranged, and at least one of a number density, a particle diameter, and a hardness of the conductive particles in one region is different from that in the other region.

4. An anisotropic conductive film comprising:
an insulating resin layer, and
conductive particles disposed in the insulating resin layer, wherein:
the anisotropic conductive film has a plurality of regions in which at least one of a number density, a particle diameter, and a hardness of the conductive particles in one region is different from that in the other region, and
the anisotropic conductive film has a region in which positions of the conductive particles in a thickness direction of the insulating resin layer are aligned on or near one surface of the insulating resin layer, and a region in which positions of the conductive particles in the thickness direction of the insulating resin layer are aligned both on or near one surface of the insulating resin layer and on or near the other surface thereof.

5. The anisotropic conductive film according to claim 4, wherein the conductive particles are regularly arranged.

6. The anisotropic conductive film according to claim 4, wherein the plurality of regions, in which at least one of a number density, a particle diameter, and a hardness of the conductive particles in one region is different from that in the other region, are arranged side by side in a short-side direction or a long-side direction of the anisotropic conductive film.

7. The anisotropic conductive film according to claim 4, including a region in which conductive particle units formed by two conductive particles overlapping with each other in a plan view of the anisotropic conductive film are regularly arranged, and a region in which single conductive particles are regularly arranged.

8. A method for producing a connection structure comprising anisotropically conductively connecting a first electronic component having a first terminal pattern and a second electronic component having a second terminal pattern different in size and pitch from the first terminal pattern to a third electronic component having a terminal pattern corresponding to each of the first terminal pattern and the second terminal pattern by the anisotropic conductive film according to claim 4.

9. An anisotropic conductive film, comprising:
a first insulating resin layer,
conductive particles disposed in the first insulating resin layer, and
a second insulating resin layer laminated on the first insulating resin layer, the second insulating resin layer having a lower minimum melt viscosity than that in the first insulating resin layer,
wherein the anisotropic conductive film has a plurality of regions in which at least one of a number density, a particle diameter, and a hardness of the conductive particles in one region is different from that in the other region.

10. A method for producing a connection structure comprising anisotropically conductively connecting a first electronic component having a first terminal pattern and a second electronic component having a second terminal pattern different in size and pitch from the first terminal pattern to a third electronic component having a terminal pattern corresponding to each of the first terminal pattern and the second terminal pattern by the anisotropic conductive film according to claim 9.

11. An anisotropic conductive film, comprising:
an insulating resin layer, and
conductive particles disposed in the insulating resin layer, wherein:
the anisotropic conductive film has a plurality of regions in which at least one of a number density, a particle diameter, and a hardness of the conductive particles in one region is different from that in the other region, and
an inclination or an undulation is formed in a surface of the insulating resin layer near the conductive particles with respect to a tangent plane of the insulating resin layer to a center portion between adjacent conductive particles.

12. The anisotropic conductive film according to claim 11, wherein the surface of the insulating resin layer near the conductive particle in the inclination is lacked with respect to the tangent plane, and an amount of the resin of the insulating resin layer right above the conductive particle in the undulation is smaller than that when the surface of the insulating resin layer right above the conductive particle is flush with the tangent plane.

13. A method for producing a connection structure comprising anisotropically conductively connecting a first electronic component having a first terminal pattern and a second electronic component having a second terminal pattern different in size and pitch from the first terminal pattern to a third electronic component having a terminal pattern corresponding to each of the first terminal pattern and the second terminal pattern by the anisotropic conductive film according to claim 11.

14. A method for producing an anisotropic conductive film, comprising:
- a first pushing step of attaching conductive particles to one surface of an insulating resin layer and pushing the conductive particles into the insulating resin layer; and
- a second pushing step of attaching conductive particles to a region that is a part of a region in a plan view where the conductive particles have been pushed in in the first pushing step, or to a region that includes the entire region in the plan view where the conductive particles have been pushed in in the first pushing step, or to a region that partially overlaps in the plan view with the region where the conductive particles have been pushed in in the first pushing step, and pushing the conductive particles into the insulating resin layer, wherein
- a plurality of regions having at least one of a number density, a particle diameter, and a hardness of conductive particles in one region is different from that in the other region are formed.

15. The method for producing an anisotropic conductive film according to claim 14, wherein the conductive particles to be pushed in the insulating resin layer in the first pushing step and the conductive particles to be pushed in the insulating resin layer in the second pushing step are the same as each other in terms of the particle diameter and the hardness.

16. The method for producing an anisotropic conductive film according to claim 14, wherein the conductive particles to be pushed in the insulating resin layer in the first pushing step and the conductive particles to be pushed in the insulating resin layer in the second pushing step are different from each other in terms of the particle diameter or the hardness.

17. The method for producing an anisotropic conductive film according to claim 14, wherein the arrangement or number density of the conductive particles to be pushed in the insulating resin layer in the first pushing step and the arrangement or number density of the conductive particles to be pushed in the insulating resin layer in the second pushing step are different from each other.

18. The method for producing an anisotropic conductive film according to claim 14, wherein the conductive particles are attached to the insulating resin layer using a transfer mold in the first pushing step, and the conductive particles are attached to the insulating resin layer using the transfer mold in the second pushing step.

19. The method for producing an anisotropic conductive film according to claim 14, wherein the conductive particles are attached to the one surface or the other surface of the insulating resin layer in the second pushing step.

20. The method for producing an anisotropic conductive film according to claim 14, wherein the insulating resin layer into which the conductive particles have been pushed is slit after the second pushing step.

21. A method for producing a connection structure comprising anisotropically conductively connecting a first electronic component having a first terminal pattern and a second electronic component having a second terminal pattern different in size and pitch from the first terminal pattern to a third electronic component having a terminal pattern corresponding to each of the first terminal pattern and the second terminal pattern by an anisotropic conductive film, wherein
- as the anisotropic conductive film, an anisotropic conductive film having at least one of a region in which conductive particles are regularly arranged and a plurality of regions in which at least one of a number density, a particle diameter, and a hardness of the conductive particles in one region is different from that in the other region is used.

22. The method for producing a connection structure according to claim 21, comprising pressure bonding the first electronic component and the second electronic component, which have been mounted on the third electronic component via the anisotropic conductive film, by a pressure tool from sides of the first electronic component and the second electronic component.

23. The method for producing a connection structure according to claim 21, wherein the first electronic component and the second electronic component are simultaneously pressure bonded.

* * * * *